(12) United States Patent
Jain et al.

(10) Patent No.: US 12,425,047 B2
(45) Date of Patent: Sep. 23, 2025

(54) METHODS AND APPARATUS TO PERFORM WEIGHT AND ACTIVATION COMPRESSION AND DECOMPRESSION

(71) Applicant: INTEL CORPORATION, Santa Clara, CA (US)

(72) Inventors: Nilesh Jain, Portland, OR (US); Menachem Adelman, Haifa (IL); Raanan Sade, Kibutz Sarid (IL); Ravishankar Iyer, Portland, OR (US); Rajesh Poornachandran, Portland, OR (US); Yash Akhauri, Uttar Pradesh (IN)

(73) Assignee: INTEL CORPORATION, Santa Clara, CA (US)

( * ) Notice: Subject to any disclaimer, the term of this patent is extended or adjusted under 35 U.S.C. 154(b) by 951 days.

(21) Appl. No.: 17/483,693

(22) Filed: Sep. 23, 2021

(65) Prior Publication Data

US 2022/0012592 A1    Jan. 13, 2022

(30) Foreign Application Priority Data

Jun. 15, 2021    (IN) .............................. 202141026534

(51) Int. Cl.
*H03M 7/30*    (2006.01)
*G06F 17/16*    (2006.01)
*G06N 3/082*    (2023.01)

(52) U.S. Cl.
CPC .............. *H03M 7/70* (2013.01); *G06F 17/16* (2013.01); *G06N 3/082* (2013.01)

(58) Field of Classification Search
CPC . H03M 7/30; H03M 7/70; G06N 3/02; G06N 3/082; G06F 17/16
See application file for complete search history.

(56) References Cited

U.S. PATENT DOCUMENTS

| | | | |
|---|---|---|---|
| 7,680,992 B1 * | 3/2010 | Van Dyke | G06F 12/1425 711/158 |
| 2003/0031371 A1 * | 2/2003 | Kato | G06T 9/00 382/239 |
| 2018/0150991 A1 * | 5/2018 | Tannenbaum | G06T 15/005 |

(Continued)

OTHER PUBLICATIONS

Intel, "Intel C++ Compiler Classic Developer Guide and Reference," retrieved from [https://www.intel.com/content/www/us/en/developer/articles/guide/download-documentation-intel-compiler-current-and-previous.html], Version 2021.3, 2021, 2354 pages.

*Primary Examiner* — Andrew Caldwell
*Assistant Examiner* — Kenny K. Bui
(74) *Attorney, Agent, or Firm* — NICHOLSON DE VOS WEBSTER & ELLIOTT LLP

(57) ABSTRACT

Methods, apparatus, systems, and articles of manufacture to perform weight and activation compression and decompression are disclosed. An example apparatus includes memory, instructions in the apparatus, and processor circuitry to execute the instructions to execute a compression operation to obtain compressed data corresponding to weights in a weight matrix, and determine meta-data associated with the weight matrix, a first portion of the meta-data indicative of whether the weight matrix is compressed, a second portion of the meta-data indicative of a cache size of the compressed data, and a third portion of the meta-data indicative of the compression operation executed to obtain the compressed data.

18 Claims, 18 Drawing Sheets

(56) References Cited

U.S. PATENT DOCUMENTS

2018/0285733 A1* 10/2018 Mellempudi .......... G06N 3/063
2020/0104691 A1*  4/2020 Bai ....................... G06N 3/063
2020/0143249 A1*  5/2020 Georgiadis ............. H03M 7/40
2020/0233666 A1   7/2020 Valentine et al.

* cited by examiner

```
TILEDECLOADB tmm0, m512 MD, imm8 index                          ← 902 tmp = MD                              // read all the 64 metadata bytes
tileStartOffset = 1                   // as first line in the block is meta data line for i=0 to index-1                    // Calculate the Tile start offset
    tileStartOffset += MD[i].TileLength if MD[index].C                        // if compressed
    lines2Load = MD[index].TileLength
else
    lines2Load = tmm0.rows if MD[index].C == 0                   //uncompressed tile
    TILELoad tmm0, m512+TileStartOffset // stride is 64
else                                  //load compressed tile
    nextByte = 128                    // count the actual compressed bytes already read,
                                      // start at first byte after 2 rows of significants
    for i=0 to tmm0.rows
        tmm0.row[i] = decompress_Ld_byte(MD+TileStartOffset, NextByte, i)
```

```
                                      ← 904 decompress_Ld_byte (mm512 TileStart, NextByte, i)

significants = TileStartOffset+8*i
// load the 64 bits of significant for the current row for j=0 to 63
    if Significants[j] == 1
        Data[j] = TileStart+NextByte
        NextByte++
    else
        Data[j] = 0 return Data
```

FIG. 9

METHODS AND APPARATUS TO PERFORM WEIGHT AND ACTIVATION COMPRESSION AND DECOMPRESSION

RELATED APPLICATION

This patent claims priority to and the benefit of Indian Patent Application Serial No. 202141026534, which was filed on Jun. 15, 2021. Indian Patent Application No. 202141026534 is hereby incorporated herein by reference in its entirety.

FIELD OF THE DISCLOSURE

This disclosure relates generally to machine learning, and, more particularly, to methods and apparatus to determine neural network weights and perform activation compression and decompression.

BACKGROUND

There is a large diversity in the use cases for deep learning, which has subsequently given rise to an explosion in demand for accelerated inference. With the diversity in use cases, neural network sizes have been on a consistent upward progression, with model complexity increasing consistently.

BRIEF DESCRIPTION OF THE DRAWINGS

FIG. 9 illustrates example pseudocode representative of example decompression operations executable by the matrix decompressing circuitry of FIG. 6.

Figure 1:
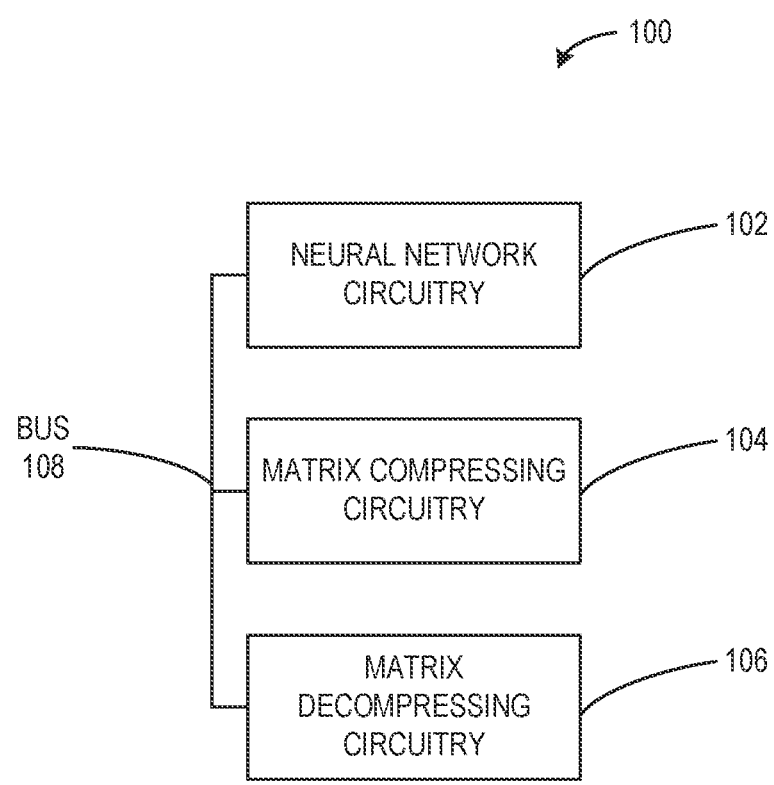
FIG. 1 illustrates an example system in accordance with the teachings of this disclosure.

In general, the same reference numbers will be used throughout the drawing(s) and accompanying written description to refer to the same or like parts. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmed with instructions to perform specific operations and including one or more semiconductor-based logic devices (e.g., electrical hardware implemented by one or more transistors). Examples of processor circuitry include programmed microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of the processing circuitry is/are best suited to execute the computing task(s).

DETAILED DESCRIPTION

Small batch size artificial intelligence utilizes significant memory bandwidth, such as when an artificial intelligence system fetches neural network weights (e.g., a weight matrix) from a dynamic random-access memory (DRAM) to perform an inference. As such, the weight matrix can cause bottlenecking that limits a rate at which the neural network performs an inference.

To address the performance bottlenecking, the memory bandwidth may be increased. However, increasing memory bandwidth comes at an increased Total Cost of Ownership (TCO) and opportunity cost for a user (e.g., costs associated with implementing High Bandwidth Memory (HBM), adding more memory channels or dual in-line memory modules (DIMMs), etc.). Additionally, bandwidth problems may still manifest with the increased memory bandwidth when moving the neural network weights between the layers as a result of large weight matrices and/or weight matrices having large sparsity.

Previous solutions utilize structured sparsity to allow certain computations to be skipped. Such solutions involve re-training the neural network to zero-out certain convolutional filters or skip large continuous blocks of data. However, re-training neural networks to utilize structured sparsity is not always feasible and resources and requirements associated with re-training can present implementation challenges.

Examples disclosed herein generate meta-data corresponding to a matrix (e.g., a tile) of neural network weights. In examples disclosed herein, the meta-data indicates whether the matrix is compressed. In response to the matrix being compressed, the meta-data indicates a cache size of the compressed matrix and a compression operation utilized to compress the matrix. Accordingly, the meta-data indicates a location of the compressed matrix and a process to be executed to decompress the matrix.

Examples disclosed herein utilize unstructured sparsity, which enables over 80% sparsification in neural networks while maintaining an accuracy thereof. Unstructured sparsity can be utilized to compress neural network weights while reducing the bandwidth utilization between a dynamic random access memory (DRAM) and a core and/or between cores. Unstructured sparsity is a more general approach to neural network sparsification and subsumes all methods that focus on structured sparsity. Accordingly, the example program disclosed herein is flexible for usage with a mixed sparse model. In turn, the sparsified neural networks reduce a memory bandwidth requirement associated with performing an inference while maintaining an accuracy thereof. Additionally, performing unstructured sparsification on the neural network weights can accelerate a rate at which the neural network performs an inference.

Moreover, examples disclosed herein provide a methodology that leverages advanced vector extension (AVX) and advanced matrix extension (AMX) technology to enable compression of quantized neural network weights with unstructured sparsity. For example, an example program (e.g., a machine learning program) that utilizes AVX can utilize spare processing cycles to compress and/or decompress neural network weights. As such, examples disclosed herein improve compute efficiency (e.g., tile matrix multiplying via AMX, execution units on GPUs) in addition to utilizing bandwidth efficiently. Specifically, the example program can improve data efficiency of a cache such that the cache improves from a low-level cache (LLC) to a mid-level cache (MLC).

FIG. 1 illustrates an example system 100 in accordance with examples disclosed herein. In FIG. 1, the system 100 includes neural network circuitry 102, matrix compressing circuitry 104, and matrix decompressing circuitry 106. In FIG. 1, the neural network circuitry 102, the matrix compressing circuitry 104, and the matrix decompressing circuitry 106 are communicatively coupled via a bus 108.

In the illustrated example of FIG. 1, the neural network circuitry 102 includes weight matrices (e.g., tiles) associated with a deep learning model. Accordingly, the neural network circuitry 102 can obtain inferences based on the weight matrices associated with the deep learning model. In FIG. 1, in response to the deep learning model being trained, the neural network circuitry 102 transmits the weight matrices to the matrix compressing circuitry 104.

In the illustrated example of FIG. 1, the matrix compressing circuitry 104 executes a compression process to obtain compressed data corresponding to weights in the weight matrices. Additionally, the matrix compressing circuitry 104 determines meta-data associated with the compressed data and/or the weight matrices, as discussed further in examples disclosed herein. In FIG. 1, the matrix compressing circuitry 104 transmits the compressed data and the meta-data to the matrix decompressing circuitry 106.

In some examples, the matrix compressing circuitry 104 is disconnected from the bus 108 in response to transmitting the compressed data and the meta-data to the matrix decompressing circuitry 106. For example, the matrix compressing circuitry 104 can compress the weight matrices during an installation process associated with the neural network circuitry 102. Accordingly, the matrix decompressing circuitry 106 can store the compressed data and the meta-data for usage.

In the illustrated example of FIG. 1, the matrix decompressing circuitry 106 decompresses at least a portion of the compressed data to obtain one or more of the weight matrices in response to a request from the neural network circuitry 102. For example, the request from neural network circuitry 102 can include an address of a respective weight matrix. In FIG. 1, the matrix decompressing circuitry 106 decompresses the compressed data based on the meta-data, as discussed further in examples disclosed herein. In FIG. 1, the matrix decompressing circuitry 106 transmits the uncompressed data to the neural network circuitry 102, which, in turn, can perform an inference based on a received input(s).

Figure 2:
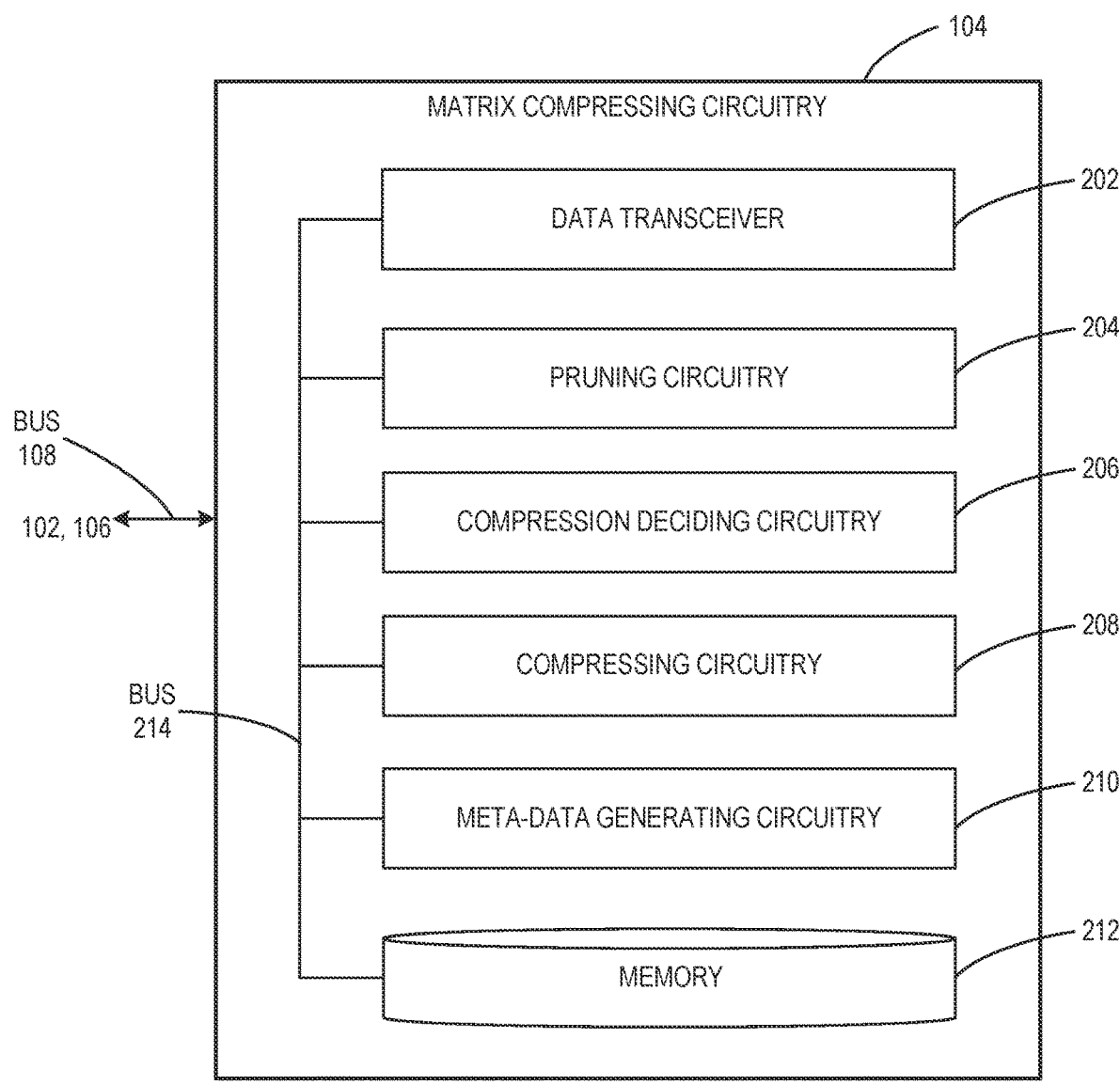
FIG. 2 illustrates example matrix compressing circuitry of the system of FIG. 1.

FIG. 2 illustrates the example matrix compressing circuitry 104 of FIG. 1. In FIG. 2, the matrix compressing circuitry 104 includes a data transceiver 202, pruning circuitry 204, compression deciding circuitry 206, compressing circuitry 208, meta-data generating circuitry 210, and a memory (e.g., a linear memory, a DRAM, etc.) 212. In FIG. 1, the data transceiver 202, the pruning circuitry 204, the compression deciding circuitry 206, the compressing circuitry 208, the meta-data generating circuitry 210, and the memory 212 are communicatively coupled via a bus 214.

In the illustrated example of FIG. 2, the data transceiver 202 receives weight matrices from the neural network circuitry 102. In turn, the data transceiver 202 can transmit the weight matrices to the pruning circuitry 204. In FIG. 2, the data transceiver 202 transmits compressed data and meta-data associated with the compressed data to the matrix decompressing circuitry 106. Specifically, the data transceiver 202 transmits data stored in the memory 212 to the matrix decompressing circuitry 106.

In the illustrated example of FIG. 2, the pruning circuitry 204 prunes weights in the weight matrices. For example, the pruning circuitry 204 can prune the weights in the weight matrices that are below a threshold value. The deep learning model associated with the neural network circuitry 102 is trained to re-learn the weights that are below the threshold during a training period. As such, an accuracy of the deep learning model is maintained with pruning. In FIG. 2, the pruning circuitry 204 transmits the weight matrices to the compression deciding circuitry 206.

In the illustrated example of FIG. 2, the compression deciding circuitry 206 determines whether the respective weight matrices are compressible and, if so, which compression process to utilize. For example, the compression deciding circuitry 206 can determine whether a weight matrix is compressible based on weights in the weight matrix and/or potential space savings that would result from compressing the weight matrix. In some examples, the compression deciding circuitry 206 identifies a quantity of weights in the weight matrix having a value of zero in response to the pruning circuitry 204 pruning the weight matrix. For example, the compression deciding circuitry 206 can compare the weights in the weight matrix having a value of zero to a weight threshold (e.g., four weights, five weights, six weights, etc.). Further, the compression deciding circuitry 206 can decide not to compress the weight matrix in response to the weight matrix having less weights with a value of zero than the weight threshold. Specifically, the compression deciding circuitry 206 determines space savings that would result from compressing the weight matrix would be less than a threshold (e.g., one byte). In turn, the compression deciding circuitry 206 accelerates collective compression of the weight matrices by skipping compression operations that would otherwise result in insignificant space savings (e.g., less than one byte). In turn, the compression deciding circuitry 206 can transmit the weight matrix to the meta-data generating circuitry 210 and/or the memory 212. In some examples, the compression deciding circuitry 206 transits a signal indicative of the weight matrix being uncompressed to the meta-data generating circuitry 210.

In the illustrated example of FIG. 2, the compression deciding circuitry 206 determines a compression process to be executed by the compressing circuitry 208. In some examples, the compression deciding circuitry 206 determines the compression process to be executed by the compressing circuitry 208 based on the weights in the weight matrix. For example, the compression deciding circuitry 206 can determine the compressing circuitry 208 is to execute a first compression process (e.g., "zero compression") in response to the weight matrix including at least one weight having a non-zero value. In some examples, the compression deciding circuitry 206 determines the compressing circuitry 208 is to execute a second compression process (e.g., "all zero") in response to the weights of the weight matrix all having values of zero. In FIG. 2, the compression deciding circuitry 206 transmits a signal indicative of the compression process to be executed to the compressing circuitry 208 and the meta-data generating circuitry 210.

In the illustrated example of FIG. 2, the compressing circuitry 208 compresses the weight matrices. In FIG. 2, the compressing circuitry 208 executes the compression process determined by the compression deciding circuitry 206 to compress the respective weight matrices. For example, the compressing circuitry 208 can execute a first function to implement the first compression process in response to receiving a first signal via the compression deciding circuitry 206. Further, the compressing circuitry 208 can execute a second function to implement the second compression process in response to receiving a second signal via the compression deciding circuitry 206. In some examples, when the compressing circuitry 208 executes the first compression process, the compressing circuitry 208 is to generate a bitmap indicative of respective locations of the weights in a weight matrix. Specifically, the compressing circuitry 208 converts each byte in the weight matrix to a respective bit in the bitmap. Further, the compressing circuitry 208 is to pack non-zero weights in the weight matrix into a compressed array.

In FIG. 2, the compressing circuitry 208 transmits compressed data including the bitmap and the dense array to the meta-data generating circuitry 210 and the memory 212. In FIG. 2, the compressing circuitry 208 stores the compressed data for consecutive weight matrices in consecutive sets of cache lines in the memory 212. In some examples, the compressing circuitry 208 stores the bitmap in an initial cache line of a set of cache lines for the respective weight matrix. In such examples, the compressing circuitry 208 stores the dense array in one or more cache lines subsequent to the initial bitmap cache line in the set of cache lines for the respective weight matrix.

In the illustrated example of FIG. 2, the meta-data generating circuitry 210 determines meta-data for the compressed data. For example, the meta-data generating circuitry 210 can generate 1 byte of meta-data for the compressed data associated with the respective weight matrices. In some examples, meta-data generating circuitry 210 indicates a size of the compressed data and/or a method according to which the respective weight matrix was compressed in the meta-data, as discussed further in association with FIG. 3. In FIG. 2, the meta-data generating circuitry 210 stores the meta-data via the memory 212. Specifically, the meta-data generating circuitry 210 stores the meta-data for the respective weight matrices in a leading cache line of the memory 212.

In the illustrated example of FIG. 2, the memory 212 stores the meta-data and the compressed data. In FIG. 2, the memory 212 is a linear memory. In FIG. 2, the memory 212 organizes the meta-data and the compressed data by cache lines. For example, a first cache line of the memory 212 can include the meta-data for each of the respective weight matrices. Additionally, the memory 212 can include the compressed data associated with a first weight matrix in a first set of cache lines positioned after the first cache line. Likewise, the memory 212 can include the compressed data associated with a second weight matrix in a second set of cache lines positioned after the first set of cache lines. Moreover, the first cache line of the memory 212 includes the meta-data associated with the first weight matrix followed by the meta-data for the second weight matrix to enable mapping between the meta-data and the associated compressed data.

Figure 3:
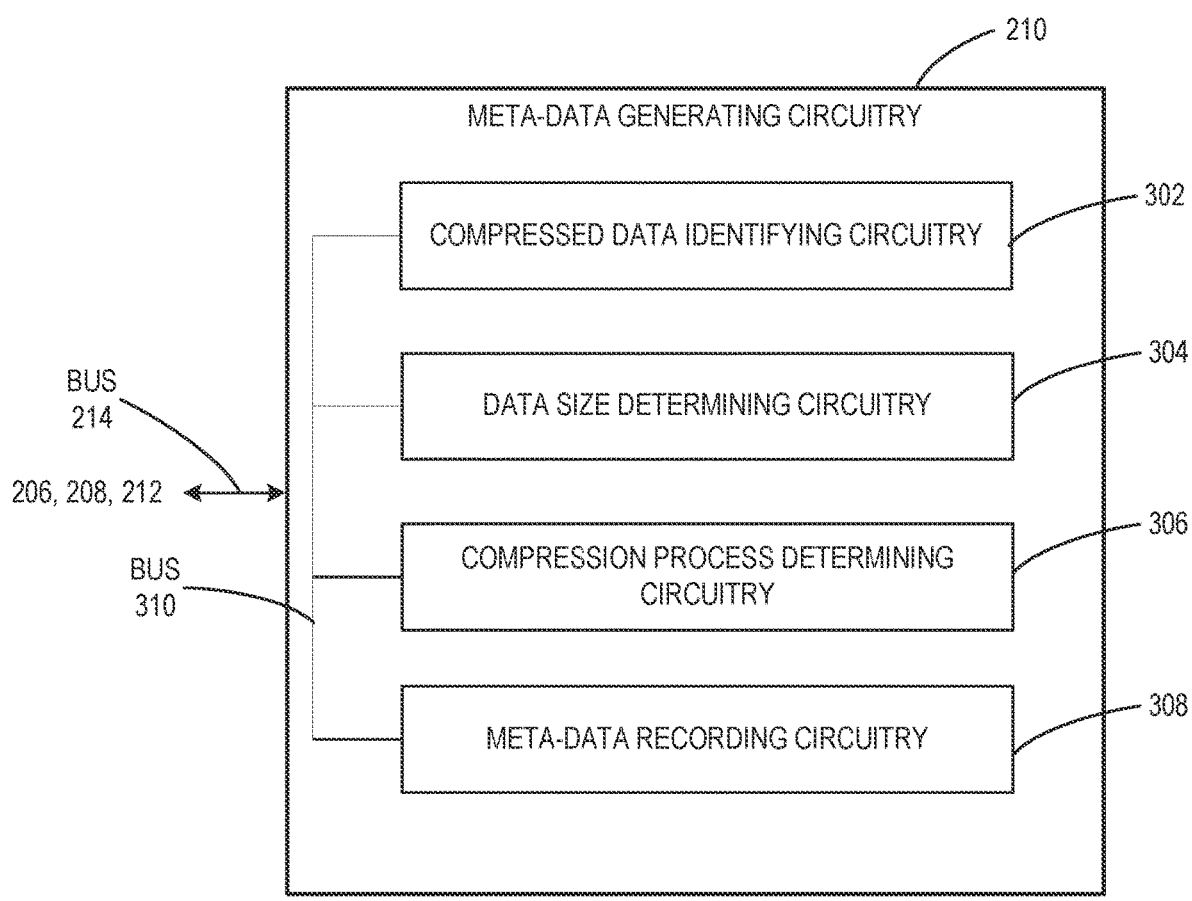
FIG. 3 illustrates example meta-data generating circuitry of the example matrix compressing circuitry of FIG. 2.

FIG. 3 illustrates the meta-data generating circuitry 210 of FIG. 2. In the illustrated example of FIG. 3, the meta-data generating circuitry 210 includes compressed data identifying circuitry 302, data size determining circuitry 304, compression process determining circuitry 306, and meta-data recording circuitry 308. In the illustrated example of FIG. 3, the compressed data identifying circuitry 302, the data size determining circuitry 304, the compression process determining circuitry 306, and the meta-data recording circuitry are communicatively coupled via a bus 310.

In some examples, the meta-data generating circuitry 210 can receive compressed data via the compressing circuitry 208 and/or accesses the compressed data via the memory 212 in response to a weight matrix being compressed. In some examples, the meta-data generating circuitry 210 receives a signal indicative of a compression process executed to obtain the compressed data via the compression deciding circuitry 206. In some examples, the meta-data generating circuitry 210 receives the weight matrix and/or a signal indicative of the weight matrix being uncompressed via the compression deciding circuitry 206.

In the illustrated example of FIG. 3, the compressed data identifying circuitry 302 determines whether the received data is compressed. In FIG. 3, the compressed data identifying circuitry 302 can determine the data is compressed in response to receiving the data via the compressing circuitry 208 and/or in response to receiving the signal indicative of the compression process via the compression deciding circuitry 206. In FIG. 3, the compressed data identifying circuitry 302 determines the data is uncompressed in response to receiving the data via the compression deciding circuitry 206 or in response to not receiving the data via the compressing circuitry 208. In some examples, the compressed data identifying circuitry 302 determines the data is uncompressed in response to receiving a signal indicative of the weight matrix being uncompressed via the compression deciding circuitry 206. In FIG. 3, the compressed data identifying circuitry 302 indicates whether the data is compressed to the meta-data recording circuitry 308.

In the illustrated example of FIG. 3, the data size determining circuitry 304 determines a size of the data in response to the data being compressed. In some examples, when the data is compressed, the data size determining circuitry 304 determines a cache size of the data in response to receiving the data via the compressing circuitry 208 and/or accessing the data via the memory 212. For example, the data size determining circuitry 304 can determine a quantity of cache lines occupied by the data. In FIG. 3, the data size determining circuitry 304 transmits a signal indicative of the quantity of cache lines occupied by the weight matrix to the meta-data recording circuitry 308.

In some examples, the data size determining circuitry 304 determines whether the data is compressed based on the cache size of the data. For example, the data size determining circuitry 304 can determine the data is uncompressed in response to the data occupying a predetermined cache size (e.g., an original size of the weight matrix) associated with an uncompressed weight matrix, such as sixteen cache lines. Accordingly, when the cache size of the data is smaller than the predetermined cache size, the data size determining circuitry 304 determines the data is compressed. In some examples, the data size determining circuitry 304 transmits a signal indicative of whether the data is compressed to the meta-data recording circuitry 308.

In the illustrated example of FIG. 3, the compression process determining circuitry 306 determines the process executed to compress the weight matrix. In FIG. 3, the compression process determining circuitry 306 determines the executed compression process based on the signal indicative of the compression process received via compression deciding circuitry 206. In some examples, the compression process determining circuitry 306 analyzes the compressed weight matrix to determine the executed compression process. For example, the compression process determining circuitry 306 can determine an "all zero" compression process was executed to obtain the compressed weight matrix in response to the weight matrix only including weights having a value of zero. Further, the compression process determining circuitry 306 can determine a "zero compression" process was executed to obtain the compressed weight matrix in response to the data including a bitmap and/or a dense array of weights having non-zero values. In FIG. 3, the compression process determining circuitry 306 transmits a signal indicative of the compression process executed to obtain the data to the meta-data recording circuitry 308.

In FIG. 3, the meta-data recording circuitry 308 generates meta-data corresponding to the data. Specifically, the meta-data recording circuitry 308 generates a byte of meta-data to characterize the data. In FIG. 3, the meta-data recording circuitry 308 determines a first portion of the meta-data based on whether the data is compressed or uncompressed. For example, the first portion of the meta-data can be a header bit of the byte. In some examples, the meta-data recording circuitry 308 records a first value (e.g., 1) in the header bit in response to the data being compressed and records a second value (e.g., 0) in the header bit in response to the data being uncompressed. In some examples, when the data is uncompressed, the meta-data recording circuitry 308 transmits the meta-data to the memory 212 in response to recording the second value in the header bit.

In the illustrated example of FIG. 3, the meta-data recording circuitry 308 determines a second portion of the meta-data based on a size of the data in response to the data being compressed. For example, the second portion of the meta-data can be four bits adjacent to the header bit. In FIG. 3, the meta-data recording circuitry 308 records the cache size of the compressed data in the second portion of the meta-data. For example, the meta-data recording circuitry 308 can record the quantity of cache lines occupied by the compressed data in the four bits positioned after the header bit via binary numerical values. As such, the meta-data recording circuitry 308 can indicate that the compressed data occupies up to fifteen cache lines in the four bits, which is fitting given that the uncompressed weight matrix occupies sixteen cache lines.

In the illustrated example of FIG. 3, the meta-data recording circuitry 308 determines a third portion of the meta-data based on a compression process executed to obtain the data. For example, the meta-data recording circuitry 308 can write a first value in the third portion of the meta-data in response to the receiving a first signal from the compression process determining circuitry 306 indicative of a first compression process, such as "zero compression," being executed to obtain the data. Likewise, the meta-data recording circuitry 308 can write a second value in the third portion of the meta-data in response to receiving a second signal from the compression process determining circuitry 306 indicative of a second compression process, such as 'all zero,' being executed to obtain the data.

Figure 4:
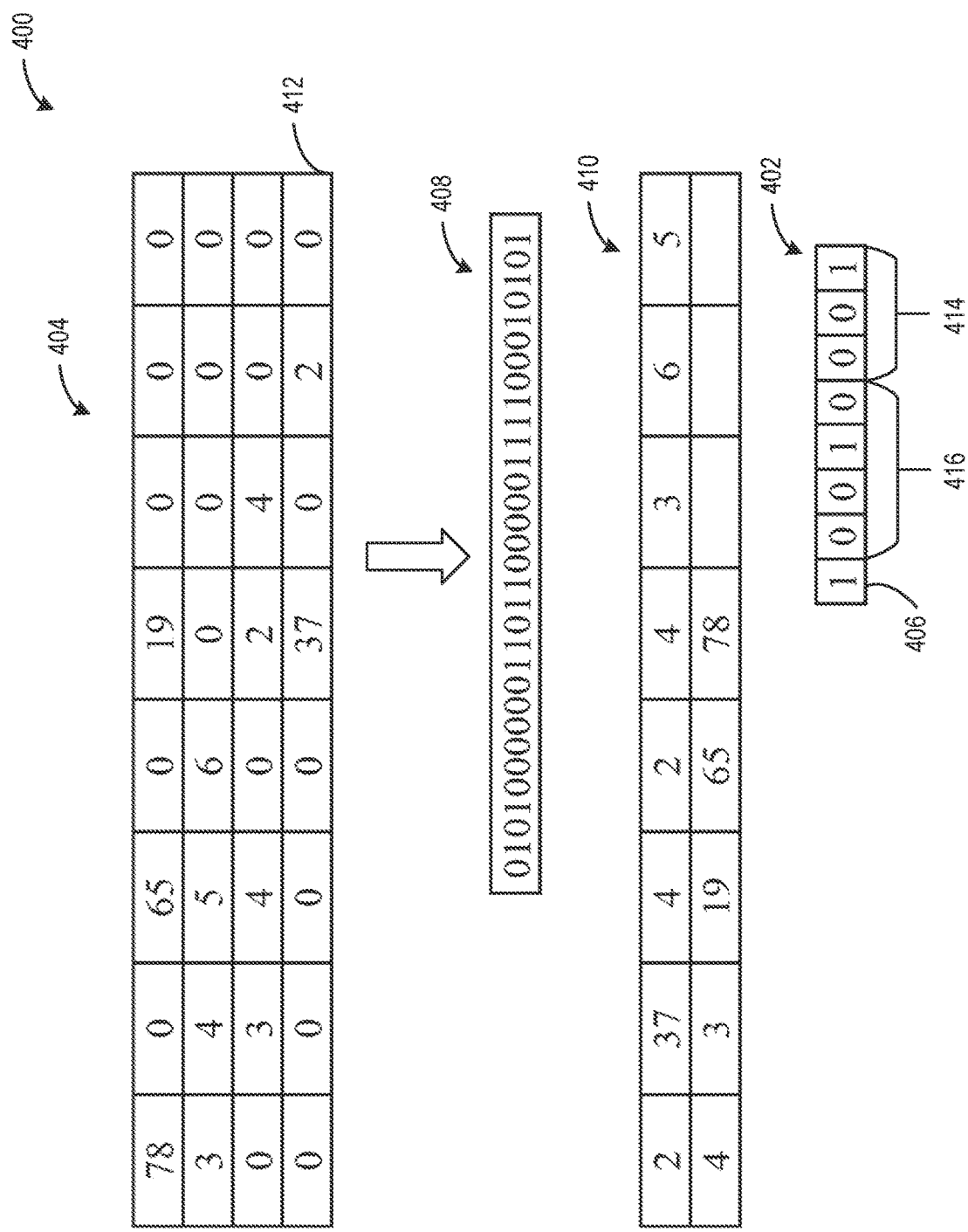
FIG. 4 illustrates an example tile compression executed by the matrix compressing circuitry of FIG. 2.

FIG. 4 illustrates example meta-data 402 generated by the matrix compressing circuitry 104 in response to executing a first example compression process (e.g., "zero compression"). In FIG. 4, the matrix compressing circuitry 104 obtains pruned data 404 in response to the pruning circuitry 204 pruning a tile of neural network weights. Specifically, the pruning circuitry 204 can remove the neural network weights in the tile that have a value below a threshold (e.g., 2) to obtain the pruned data 404. In FIG. 4, respective values in the pruned data 404 occupy a byte of data. In some examples, the tile of neural network weights includes sixty four bytes. In the illustrated example of FIG. 4, to avoid overcrowding, the pruned data 404 includes thirty two bytes corresponding to neural network weights.

In some examples, the matrix compressing circuitry 104 determines whether to compress the pruned data 404. For example, the compression deciding circuitry 206 can determine whether to compress the pruned data based on a quantity of bytes having values of zero in the pruned data. In some examples, the compression deciding circuitry 206 determines that the pruned data 404 is to be compressed in response to determining the bytes of the pruned data 404 includes a quantity of zeros that satisfies (e.g., is greater than) a first threshold. In some examples, the compression deciding circuitry 206 sets the threshold based on a quantity of zeros that would result in compressed data occupying less memory than the pruned data 404.

In the illustrated example of FIG. 4, the meta-data generating circuitry 210 determines a first portion 406 (e.g., a first bit) of the meta-data 402 based on whether the compression deciding circuitry 206 determines the pruned data 404 is to be compressed. For example, the compressed data identifying circuitry 302 can identify whether the compression deciding circuitry 206 determined the pruned data 404 is to be compressed. In FIG. 4, the meta-data recording circuitry 308 records a first value (e.g., 1) in the first bit 406 of the meta-data 402 in response to the compression deciding circuitry 206 determining the pruned data 404 is to be compressed. In some examples, the meta-data recording circuitry 308 records a second value (e.g., 0) in the meta-data 402 in response to the compression deciding circuitry 206 determining the pruned data 404 is to remain as is.

In the illustrated example of FIG. 4, in response to determining the pruned data 404 is to be compressed (e.g., the quantity of bytes having values of zero in the pruned data 404 satisfies the first threshold), the compression deciding circuitry 206 can determine the compression process to be executed by the compressing circuitry 208. In FIG. 4, the compression deciding circuitry 206 determines the compressing circuitry 208 is to execute a "zero compression" operation. In some examples, the compression deciding circuitry 206 determines a compression process for the compressing circuitry 208 to execute based on values of the bytes in the pruned data 404. For example, the compression deciding circuitry 206 can determine the compressing circuitry 208 is to execute "all zero" compression in response to determining the bytes of the pruned data 404 includes a quantity of non-zero values (e.g., non-zero weights) that satisfies (e.g., is less than) a second threshold (e.g., 1).

In the illustrated example of FIG. 4, the matrix compressing circuitry 104 executes a compression operation (e.g., "zero compression") to generate a bitmap 408 and a compressed tile 410. Specifically, executing "zero compression" includes packing non-zero weights from the pruned data 404 into the compressed tile 410 and generating the bitmap 408 to indicate respective positions of the non-zero weights. FIG. 4, the compressing circuitry 208 determines the bitmap 408 based on respective positions and values of the respective bytes of the pruned data 404. In FIG. 4, the compressing circuitry 208 determines values of respective bits in the bitmap 408 based on the values in respective bytes of the pruned data 404. For example, the compressing circuitry 208 can start at a corner byte 412 of the pruned data 404 and move left-to-right across each row recording a 0 in bits corresponding to bytes in the pruned data 404 having values of zero and recording a 1 in bits corresponding to bytes having non-zero values. Further, the compressing circuitry 208 can start at the corner byte 412 and move left-to-right across each row in the pruned data 404 packing the bytes of the pruned data 404 having non-zero values in the compressed tile 410. As such, the bitmap 408 is indicative of locations of non-zero values in the bytes of the pruned data 404 and the compressed tile 410 includes the bytes of the pruned data having non-zero values.

In the illustrated example of FIG. 4, the compression process determining circuitry 306 determines a second portion 414 (e.g., a last three bits) of the meta-data 402 based on the compression process executed by the compressing circuitry 208. In some examples, the compression process determining circuitry 306 determines the second portion of the meta-data based on the compression process determined by the compression deciding circuitry 206. As such, the meta-data generating circuitry 210 may update the second portion of the meta-data in parallel with the compressing circuitry 208 executing the compression operation. In FIG. 4, the meta-data recording circuitry 308 updates a last three bits of the meta-data 402 based on the compression operation. Specifically, the meta-data recording circuitry 308 configures the last three bits of the meta-data 402 to represent a first value corresponding to the "zero compression" operation. In some examples, the meta-data recording circuitry 402 controls the last three bits of the meta-data 402 to represent a second value corresponding to an "all zero" compression operation. Additionally, the meta-data recording circuitry 402 can configure the last three bits of the meta-data 402 to other values corresponding to other compression operations. Specifically, the last three bits of the meta-data 402 can represent up to eight distinct compression operations executable by the compressing circuitry 208.

In the illustrated example of FIG. 4, in response to the compressing circuitry 208 executing the compression operation, the data size determining circuitry 304 determines a size of the compressed data (e.g., the bitmap 408 and the compressed tile 410). For example, the data size determining circuitry 304 can determine a quantity of cache lines occupied by the bitmap 408 and the compressed tile 410. In FIG. 4, the meta-data recording circuitry 308 updates a third portion 416 (e.g., an inner four bits) of the meta-data 402 based on the quantity of cache lines occupied by the bitmap 408 and the compressed tile 410. For example, the meta-data recording circuitry 308 can configure the inner four bits of the meta-data 402 to be equivalent to the quantity of cache lines occupied by the bitmap 408 and the compressed tile 410.

In FIG. 4, the pruned data 404 corresponds to a first tile of neural network weights utilized by the neural network circuitry 102. In some examples, the neural network circuitry 102 utilizes sixty four tiles of neural network weights to perform an inference. Accordingly, the matrix compressing circuitry 104 may compress a remaining sixty three tiles similar to the first tile. Similarly, the matrix compressing circuitry 104 can generate a respective byte of meta-data, similar to the meta-data 402, for the respective remaining sixty three tiles.

Figure 5:
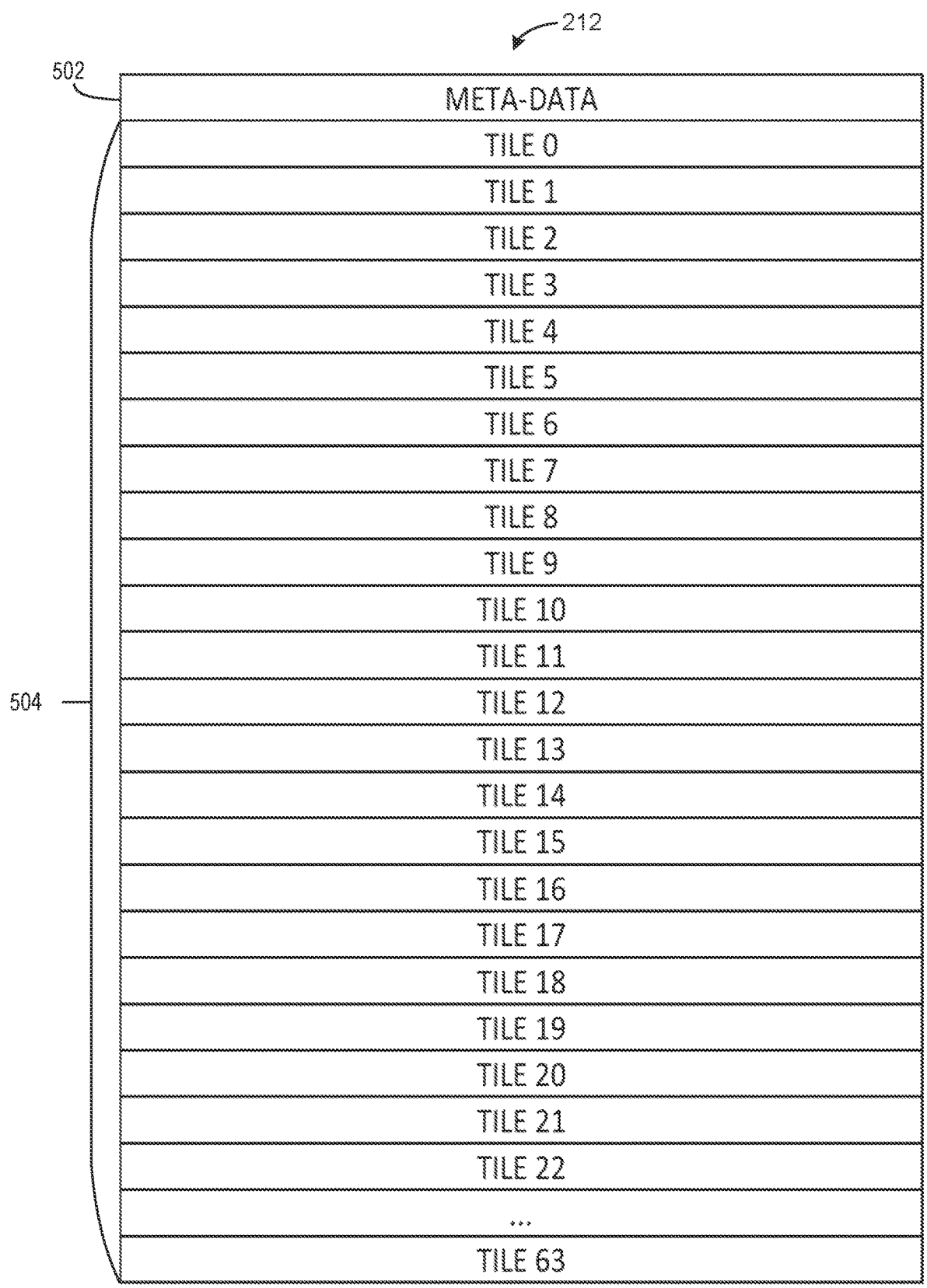
FIG. 5 illustrates an example memory of the example matrix compressing circuitry of FIG. 2.

FIG. 5 illustrates an example implementation of the memory 212. In the illustrated example of FIG. 5, the memory 212 is a linear memory. In FIG. 5, the memory 212 includes a meta-data cache line 502 and tiles 504. In FIG. 5, the meta-data cache line 502 includes sixty four bytes of meta-data. The respective bytes of the meta-data are representative of respective ones of the tiles. Accordingly, respective bytes in the meta-data cache line 502 provide information corresponding to the respective one of the tiles 504 associated therewith.

In FIG. 5, the respective bytes in the meta-data cache line 502 indicates whether the associated one of the tiles 504 is compressed. In FIG. 5, in response to the respective one of the tiles 504 being compressed, an associated meta-data byte in the meta-data cache line 502 indicates a quantity of cache lines occupied by the respective one of the tiles 504. In FIG. 5, in response to the respective one of the tiles 504 being uncompressed, an associated meta-data byte in the meta-data cache line 502 indicates the respective one of the tiles 504 is uncompressed and, in turn, a quantity of cache lines associated with the respective one of the tiles 504 is known. As such, respective bytes of the meta-data cache line 502 provides a map to the respective tiles 504.

In FIG. 5, in response to the associated one of the tiles 504 being compressed, the meta-data cache line 502 indicates a compression process executed to compress the respective one of the tiles 504. As such, the meta-data cache line 502 indicates a decompression process to be executed for the respective tiles 504.

Figure 6:
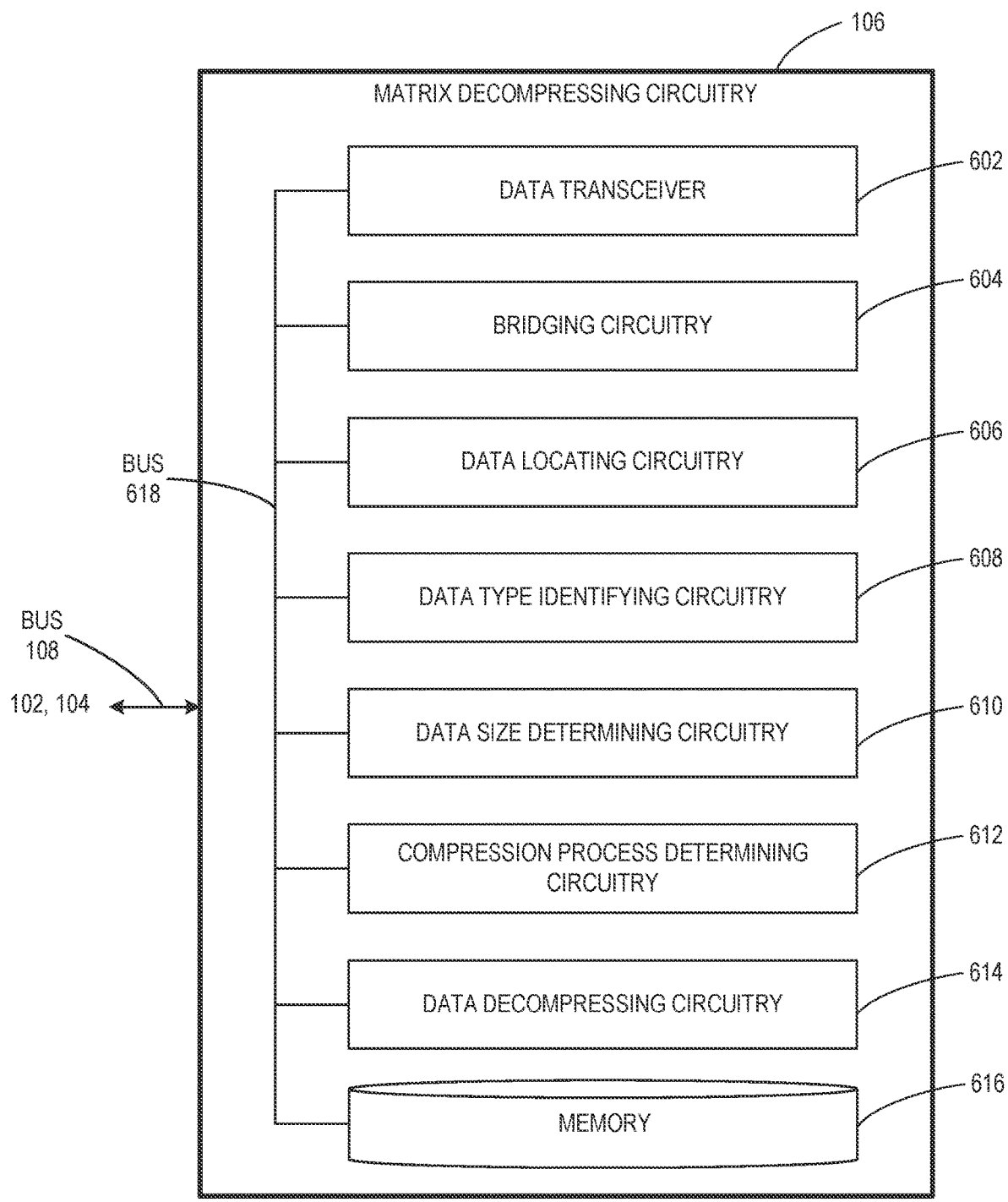
FIG. 6 illustrates example matrix decompressing circuitry of the system of FIG. 1.

FIG. 6 illustrates the example matrix decompressing circuitry 106 of the system 100 of FIG. 1. In FIG. 6, the matrix decompressing circuitry 106 includes a data transceiver 602, bridging circuitry 604, data locating circuitry 606, data type identifying circuitry 608, data size determining circuitry 610, compression process determining circuitry 612, data decompressing circuitry 614, and memory 616. In FIG. 6, the data transceiver 602, the bridging circuitry 604, the data locating circuitry 606, the data type identifying circuitry 608, the data size determining circuitry 610, the compression process determining circuitry 612, and the data decompressing circuitry 614 are communicatively coupled via a bus 618.

In FIG. 6, the data transceiver 602 receives data corresponding to neural network weights from the matrix compressing circuitry 104 via the bus 108. For example, the data transceiver 602 can receive data stored in the memory 212 of the matrix compressing circuitry 104. In some examples, the data transceiver 602 stores the data in the memory 616 to enable the matrix compressing circuitry 104 to disconnect from the bus 108 of FIG. 1 in response to providing the data to the matrix decompressing circuitry 106. In FIG. 6, the data transceiver 602 receives a data request from the neural network circuitry 102 via the bus 108. In FIG. 6, in response to the data being decompressed, the data transceiver 602 transmits the data to the neural network circuitry 102 via the bus 108.

In FIG. 6, the data bridging circuitry 604 determines meta-data (e.g., the meta-data 402) associated with a tile based on the data request. For example, the data bridging circuitry 604 can determine the meta-data associated with the tile based on an address of the tile. In FIG. 6, the data bridging circuitry 604 can correlate the address of the tile with the byte of meta-data associated with the tile. For example, the address of the tile can be a tile number and the data bridging circuitry 604 can determine the byte of meta-data that corresponds to the tile number. That is, in response to receiving a request for a first tile in a set of tiles, the data bridging circuitry 604 can identify a first byte of meta-data. In some examples, the data bridging circuitry 604 identifies the meta-data via the memory 616.

In FIG. 6, data locating circuitry 606 determines a location of the tile based on the meta-data. For example, the data locating circuitry 606 can analyze meta-data bytes that precede the meta-data byte associated with the tile to determine a cache line where the tile data begins. Specifically, the data locating circuitry 606 can identify a quantity of cache lines associated with the tiles that precede the tile associated with the data request based on the meta-data associated with the tiles. In turn, the data locating circuitry 606 can add the cache lines of the preceding tiles and that precede a start of the tiles (e.g., the meta-data cache line 502 of FIG. 5) to determine an offset of an initial cache line of the tile. In some examples, the data locating circuitry 606 determines the location of the initial cache line of the tile in the memory 616.

In FIG. 6, the data type identifying circuitry 608 identifies whether the tile is compressed. For example, the data type identifying circuitry 608 can determine whether the tile is compressed based on a first portion of the meta-data associated with the tile. Specifically, the data type identifying circuitry 608 identifies that the tile is compressed in response to a first bit of the meta-data including a first value (e.g., 1). Similarly, the data type identifying circuitry 608 identifies that the tile is uncompressed in response to the first bit of the meta-data including a second value (e.g., 0).

In FIG. 6, the data size determining circuitry 610 determines a size of the tile. For example, in response to the tile being compressed, the data size determining circuitry 610 can determine the size of the tile based on a second portion of the meta-data associated with the tile. In some examples, the data size determining circuitry 610 determines a quantity of cache lines that the tile occupies based on a value indicated by four bits of the meta-data adjacent to the first bit.

In FIG. 6, in response to the tile being uncompressed, the data size determining circuitry 610 determines the size of the tile is equivalent to a predetermined size (e.g., an original size of the tile, sixteen cache lines) of the tile. In some examples, a predetermined quantity of cache lines occupied by the tile, in response to being uncompressed, is one cache line greater than a maximum quantity of cache lines that the four bits of the meta-data can indicate. Specifically, the four bits of the meta-data can indicate that the tile occupies up to fifteen cache lines and, thus, in response to being uncompressed, the tile occupies sixteen cache lines. In some examples, the data request from the neural network circuitry 102 is indicative of the quantity of cache lines that the uncompressed tile occupies and, thus, the data size determining circuitry 610 can determine the quantity of cache lines for the uncompressed tile based on the data request.

In FIG. 6, in response to the tile being compressed, the compression process determining circuitry 612 determines a compression process executed to obtain the tile. For example, the compression process determining circuitry 612 can determine the compression process executed by the matrix compressing circuitry 104 based on a third portion of the meta-data associated with the tile. In some examples, the compression process determining circuitry 612 determines the executed compression process based on a value indicated by a last three bits of the meta-data. Specifically, the compression process determining circuitry 612 can correlate the value indicated by the last three bits to a compression process associated with the value. For example, the compression process determining circuitry 612 can determine a first, second, third, fourth, fifth, sixth, seventh, or eighth compression process was executed by the matrix compressing circuitry 104 in response to the last three bits of the meta-data indicating a first value, a second value, a third value, a fourth value, a fifth value, a sixth value, a seventh value, or an eighth value, respectively. Specifically, "zero compression" may be linked to the first value, "all zero" compression may be linked to the second value, and additional compression processes may be linked to the third value, the fourth value, the fifth value, the sixth value, the seventh value, and the eighth value.

In FIG. 6, in response to the tile being compressed, the data decompressing circuitry 614 decompresses the tile. For example, the data decompressing circuitry 614 can decompress the tile based on the size of the compressed tile and the compression process executed by the matrix compressing circuitry 104 to obtain the compressed tile. In FIG. 6, the data decompressing circuitry 614 accesses the compressed tile in the memory 616 based on the determined location and the size of the compressed tile. In turn, the data decompressing circuitry 614 can decompress the compressed tile based on the determined compression process executed to obtain the compressed tile. For example, in response to the matrix compressing circuitry 104 executing a "zero compression" process to obtain the compressed tile, the data decompressing circuitry 614 can decompress the compressed tile based on values of bits in a bitmap (e.g., the bitmap 408) and values of bytes in the compressed tile (e.g., the compressed tile 410). Further, in response to the matrix compressing circuitry 104 executing an "all zero" compression process to obtain the compressed tile, the data decompressing circuitry 614 can load a quantity of bytes having values of zero based on the size of the uncompressed tile.

In FIG. 6, the memory 616 includes the meta-data (e.g., the meta-data cache line 502 of FIG. 5) and the tiles associated therewith (e.g., the tiles 504 of FIG. 5). For example, the data transceiver 602 can store the meta-data and the tiles in the memory 616 in response to receiving the meta-data and the tiles from the matrix compressing circuitry 104 via the bus 108. As such, the bridging circuitry 604, the data locating circuitry 606, the data type identifying circuitry 608, the data size determining circuitry 610, the compression process determining circuitry 612, and the data decompressing circuitry 614 can access the meta-data and the tiles stored in the memory 616 via the bus 618.

Figure 7:
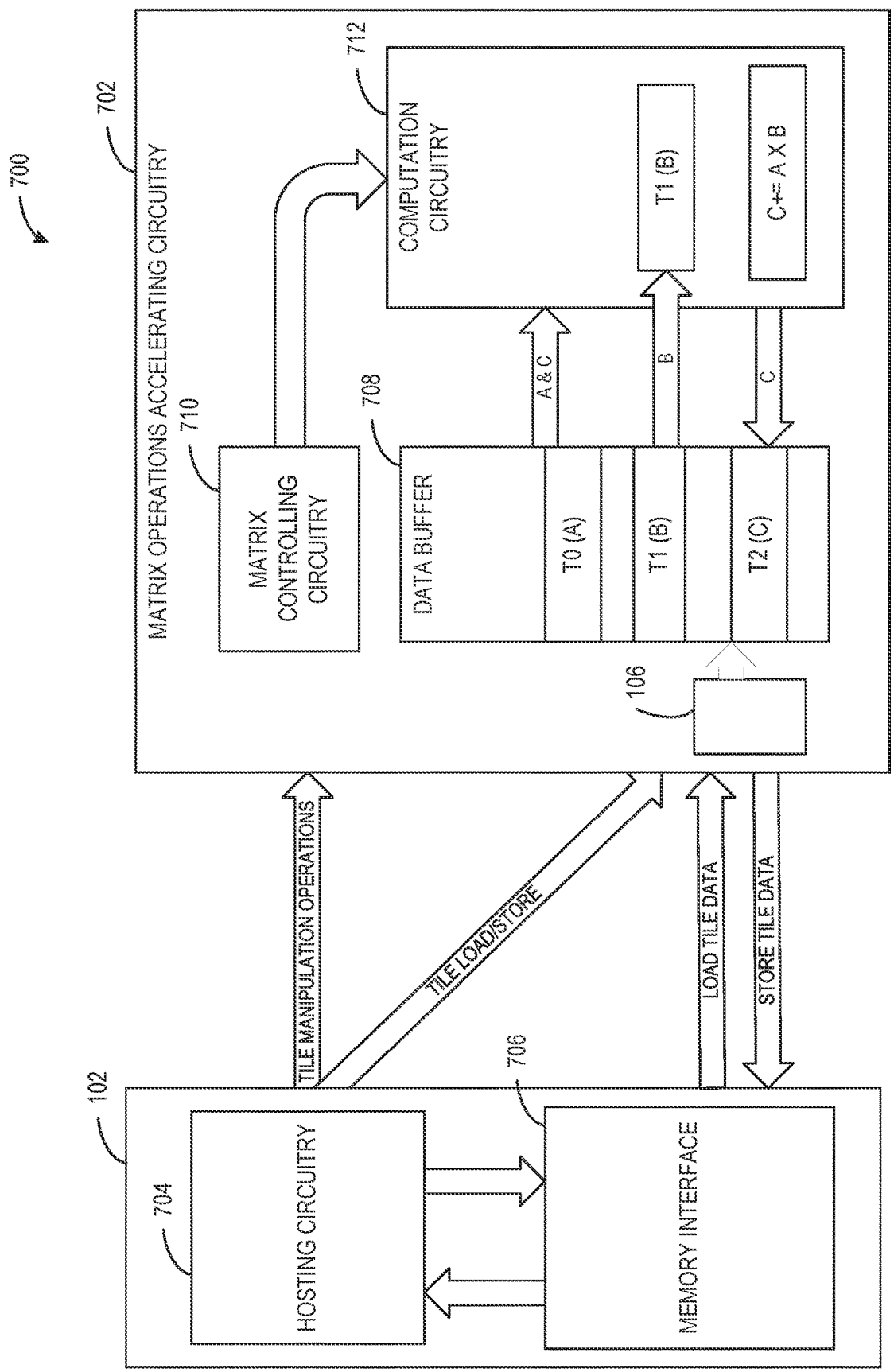
FIG. 7 illustrates an example implementation of the example matrix decompressing circuitry of FIG. 6 in an example matrix operating system.

FIG. 7 is a block diagram of an example implementation of the matrix decompressing circuitry 106 in an example matrix (e.g., tile) operating system 700 described by U.S. Patent Application 2020/0233666, which is hereby incorporated as a reference in its entirety. In the illustrated example of FIG. 7, the matrix operating system 700 includes the neural network circuitry 102 of FIG. 1 and matrix operations accelerating circuitry 702. In FIG. 7, the neural network circuitry 102 includes hosting circuitry 704 and a memory interface 706. In FIG. 7, the matrix operations accelerating circuitry 702 includes the matrix decompressing circuitry 106, a data buffer 708, matrix controlling circuitry 710, and computation circuitry 712 (e.g., fused multiple accumulate (FMA) circuitry).

In the illustrated example of FIG. 7, the hosting circuitry 704 transmits commands to the matrix operations accelerating circuitry 702. For example, the hosting circuitry 704 can transmit signals indicative of tile manipulation operations, tile load operations, and/or tile store operations to the matrix operations accelerating circuitry 702. In the illustrated example of FIG. 7, the hosting circuitry 704 and the matrix operations accelerating circuitry 702 share the memory interface 706. In some examples, the matrix operations accelerating circuitry utilizes a separate memory from the hosting circuitry 704, such as the memory 616 of FIG. 6.

In FIG. 7, the matrix decompressing circuitry 106 decompresses one or more tiles in response to receiving a signal indicative of a tile load operation to be performed for the one or more tiles from the hosting circuitry 704. In some examples, in response to receiving the signal indicative of the tile load operation, the matrix decompressing circuitry 106 loads the respective tiles via the memory interface 706. In FIG. 7, the matrix decompressing circuitry 106 enables the memory interface 706 to store compressed tiles (e.g., in response to the matrix compression circuitry 104 compressing the tiles). As such, the matrix decompressing circuitry 106 enables the memory interface 706 to utilize a reduced bandwidth to store the tiles. In turn, the matrix decompressing circuitry 106 can access and decompress the tiles at an increased rate to eliminate or otherwise reduce performance bottlenecking that occurs when full (e.g., uncompressed tiles) are to be loaded. In FIG. 7, the matrix decompressing circuitry 106 transmits decompressed tiles to the data buffer 708.

In FIG. 7, the data buffer 708 includes a plurality of registers. In FIG. 7, the computation circuitry 712 can access the decompressed tiles via the data buffer 708. In FIG. 7, the matrix controlling circuitry 710 transmits a signal indicative of a matrix operation to be performed to the computation circuitry 712 based on the tile manipulation operations indicated by the hosting circuitry 704. For example, the computation circuitry 712 can perform a matrix multiply operation using the decompressed tiles stored in the data buffer 708. In FIG. 7, the matrix decompressing circuitry 106 utilizes reduced cycles to decompress the tiles, which improves a compute efficiency of the computation circuitry 712. In some examples, in response to receiving a signal indicative of a tile store operation via the hosting circuitry 704, the computation circuitry 712 stores the results of the tile manipulation operation via the memory interface 706.

Figure 8:
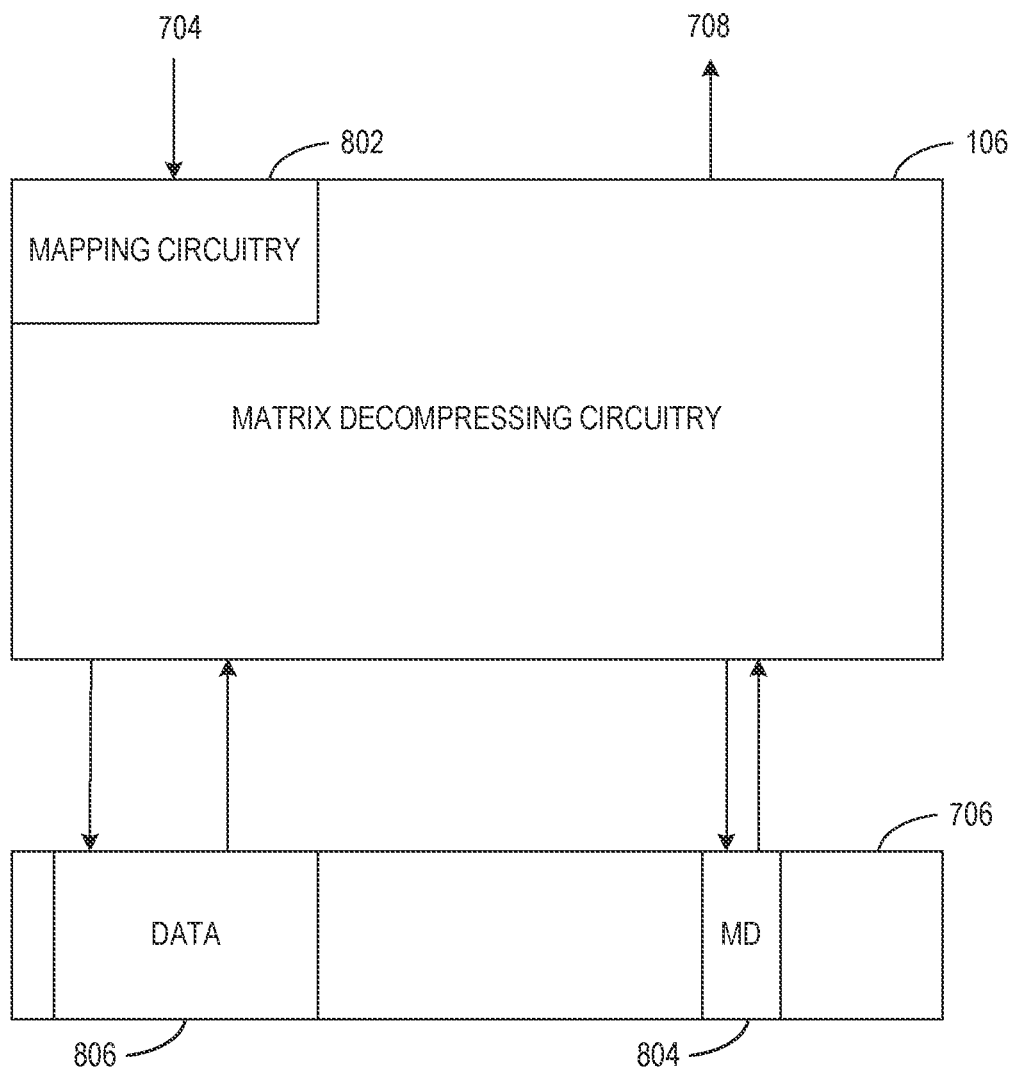
FIG. 8 illustrates another example implementation of the example matrix decompressing circuitry of FIG. 6.

FIG. 8 illustrates a block diagram representative of another example implementation of the matrix decompressing circuitry 106. In FIG. 8, the matrix decompressing circuitry 106 includes mapping circuitry 802. For example, the mapping circuitry 802 can correspond to the bridging circuitry 604 and the data locating circuitry 606. In FIG. 8, the mapping circuitry 802 receives a signal indicative of a tile to load via the hosting circuitry 704. In FIG. 8, the mapping circuitry 802 can determine a location of meta-data associated with the tile in a first portion 804 of the memory interface 706. In FIG. 8, the mapping circuitry 802 can determine a position of data (e.g., compressed data) associated with the tile in a second portion 806 of the memory interface 706.

In FIG. 8, the matrix decompressing circuitry 106 reads the first portion 804 of the memory interface 706 to identify the meta-data associated with the tile. In turn, the matrix decompressing circuitry 106 reads the second portion of the memory interface to identify the data associated with the tile. As shown in the illustrated example of FIG. 8, the first portion 804 and the second portion 806 only occupy a fraction of the memory interface 706, which enables the matrix decompressing circuitry 106 to search less memory to identify and extract the meta-data and the compressed data associated with the tile. As such, the matrix decompressing circuitry 106 utilize fewer processing cycles to gather the meta-data and the data associated with the tile. Accordingly, the matrix decompressing circuitry 106 decompresses the data based on the meta-data. Further, the matrix decompressing circuitry 106 transmits the decompressed data to the data buffer 708.

FIG. 9 illustrates example pseudocode 900 that the matrix decompressing circuitry 106 can execute to extract tile data. In FIG. 9, a first portion 902 of the pseudocode corresponds to meta-data and associated tile data loading. For example, the first portion 902 of the pseudocode 900 can be executed by the bridging circuitry 604, the data locating circuitry 606, the data type identifying circuitry 608, the data size determining circuitry 610, and the compression process determining circuitry 612 to determine characteristics (e.g., a data type, a size, a location, etc.) associated with a tile being extracted. In FIG. 9, a second portion 904 of the pseudocode 900 corresponds to decompression operations executable by the data decompressing circuitry 614 in response to the data being compressed via a "zero compression" technique. Specifically, the second portion 904 of the pseudocode 900 is a function called by the first portion 902 of the pseudocode 900 in response to the meta-data associated with the tile indicating that the matrix compression circuitry 104 executed "zero compression" to compress the tile. Accordingly, the first portion 902 of the pseudocode 900 can call other functions associated with other decompression processes in response to the meta-data associated with the tile indicating that the matrix compression circuitry 104 executed a different compression operation.

Figure 10B:
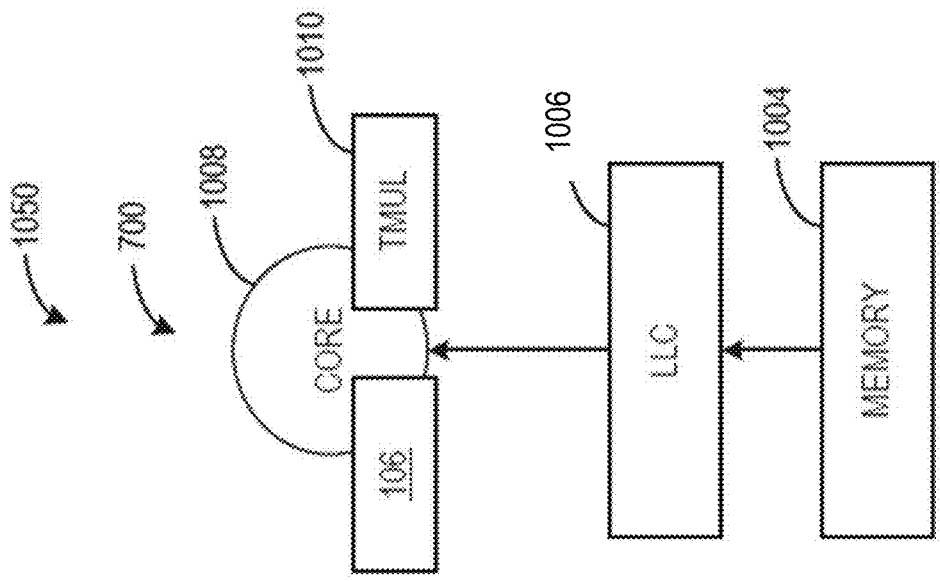
FIG. 10B illustrates an example data flow of the example matrix operating system of FIG. 7.
Figure 10A:
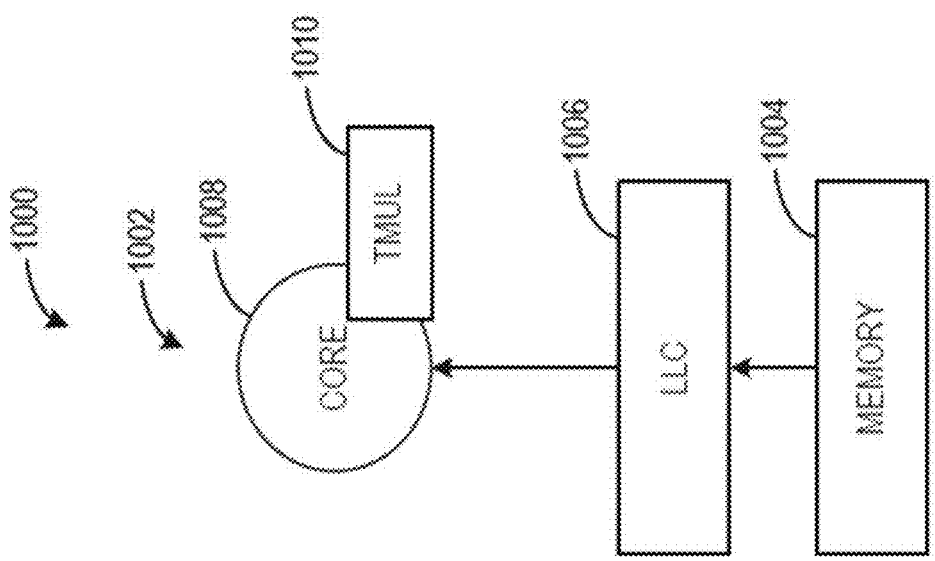
FIG. 10A illustrates an example data flow of a prior art system.

FIG. 10A illustrates a first example data flow 1000 associated with tile data extraction performed by a prior art system. In FIG. 10A, the prior art system 1002 includes a memory 1004, a load-line calibrator (LLC) 1006, a core 1008, and a tile matrix multiplying unit (TMUL) 1010. In FIG. 10A, the prior art system 1002 encounters bottlenecking between (i) the memory 1004 and the LLC 1006 and (ii) the LLC 1006 and the core 1008. As such, the bottlenecking reduces a rate at which the core 1008 can access tile data stored in the memory and, thus, reduces a rate at which the TMUL 1010 can perform computation operations using the tile data.

FIG. 10B illustrates a second example data flow 1050 associated with tile data extraction performed by the matrix decompressing circuitry 106 in the matrix operating system 700 of FIGS. 7 and/or 8. In FIG. 10B, the matrix operating system 700 includes the memory 1004, the LLC 1006, the core 1008, and the TMUL 1010. In FIG. 10B, tile data stored in the memory 1004 has been compressed by the matrix compressing circuitry 104. Accordingly, the LLC 1006 can extract the compressed tile data from the memory 1004 using a reduced bandwidth. Further, the LLC 1006 can relay the compressed tile data to the core 1008 to prevent bottlenecking that would otherwise occur when transmitting the tile data in an uncompressed form, such as in FIG. 10A. In FIG. 10B, the core 1008 includes the matrix decompressing circuitry 106, which decompresses the compressed tile data in response to a request. As such, the TMUL 1010 can perform computation operations at an increased rate.

In some examples, the matrix compressing circuitry 104 includes means for executing a compression operation to obtain compressed data corresponding to weights in a weight matrix. For example, the means for executing may be implemented by compressing circuitry 208. In some examples, the compressing circuitry 208 may be implemented by machine executable instructions such as that implemented by at least block 1110 of FIG. 11 executed by processor circuitry, which may be implemented by the example processor circuitry 1412 of FIG. 14, the example processor circuitry 1600 of FIG. 16, and/or the example Field Programmable Gate Array (FPGA) circuitry 1700 of FIG. 17. In other examples, the compressing circuitry 208 is implemented by other hardware logic circuitry, hardware implemented state machines, and/or any other combination of hardware, software, and/or firmware. For example, the compressing circuitry 208 may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to perform the corresponding operation without executing software or firmware, but other structures are likewise appropriate.

In some examples, the matrix compressing circuitry 104 includes means for determining meta-data associated with the weight matrix. For example, the means for determining may be implemented by meta-data generating circuitry 210. In some examples, the meta-data generating circuitry 210 may be implemented by machine executable instructions such as that implemented by at least blocks 1202, 1204, 1206, 1208, 1210, 1212, 1214 of FIG. 12 and/or 1112 of FIG. 11 executed by processor circuitry, which may be implemented by the example processor circuitry 1412 of FIG. 14, the example processor circuitry 1600 of FIG. 16, and/or the example Field Programmable Gate Array (FPGA) circuitry 1700 of FIG. 17. In other examples, the meta-data generating circuitry 210 is implemented by other hardware logic circuitry, hardware implemented state machines, and/or any other combination of hardware, software, and/or firmware. For example, the meta-data generating circuitry 210 may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to perform the corresponding operation without executing software or firmware, but other structures are likewise appropriate.

In some examples, the means for determining includes means for determining a first portion of the meta-data indicative of whether the weight matrix is compressed. For example, the means for determining the first portion of the meta-data may be implemented by the compressed data identifying circuitry 302.

In some examples, the means for determining includes means for determining a second portion of the meta-data indicative of a cache size of the compressed data. For example, the means for determining the second portion of the meta-data may be implemented by the data size determining circuitry 304.

In some examples, the means for determining includes means for determining a third portion of the meta-data indicative of the compression operation executed to obtain the compressed data. For example, the means for determining the third portion of the meta-data may be implemented by the compression process determining circuitry 306.

In some examples, the matrix decompressing circuitry 106 includes means for determining whether data associated with a weight matrix is compressed based on a first portion of meta-data associated with the data. For example, the means for determining may be implemented by data type identifying circuitry 608. In some examples, the data type identifying circuitry 608 may be implemented by machine executable instructions such as that implemented by at least block 1310 of FIG. 13 executed by processor circuitry, which may be implemented by the example processor circuitry 1512 of FIG. 15, the example processor circuitry 1600 of FIG. 16, and/or the example Field Programmable Gate Array (FPGA) circuitry 1700 of FIG. 17. In other examples, the data type identifying circuitry 608 is implemented by other hardware logic circuitry, hardware implemented state machines, and/or any other combination of hardware, software, and/or firmware. For example, the data type identifying circuitry 608 may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to perform the corresponding operation without executing software or firmware, but other structures are likewise appropriate.

In some examples, the matrix decompressing circuitry 106 includes means for determining a cache size of the data based on a second portion of the meta-data. For example, the means for determining may be implemented by data size determining circuitry 610. In some examples, the data size determining circuitry 610 may be implemented by machine executable instructions such as that implemented by at least blocks 1306, 1308 of FIG. 13 executed by processor circuitry, which may be implemented by the example processor circuitry 1512 of FIG. 15, the example processor circuitry 1600 of FIG. 16, and/or the example Field Programmable Gate Array (FPGA) circuitry 1700 of FIG. 17. In other examples, the data size determining circuitry 610 is implemented by other hardware logic circuitry, hardware implemented state machines, and/or any other combination of hardware, software, and/or firmware. For example, the data size determining circuitry 610 may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to perform the corresponding operation without executing software or firmware, but other structures are likewise appropriate.

In some examples, the matrix decompressing circuitry 106 includes means for determining a compression process executed to compress the data based on a third portion of the meta-data. For example, the means for determining may be implemented by compression process determining circuitry 612. In some examples, the compression process determining circuitry 612 may be implemented by machine executable instructions such as that implemented by at least block 1314 of FIG. 13 executed by processor circuitry, which may be implemented by the example processor circuitry 1512 of FIG. 15, the example processor circuitry 1600 of FIG. 16, and/or the example Field Programmable Gate Array (FPGA) circuitry 1700 of FIG. 17. In other examples, the compression process determining circuitry 612 is implemented by other hardware logic circuitry, hardware implemented state machines, and/or any other combination of hardware, software, and/or firmware. For example, the compression process determining circuitry 612 may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to perform the corresponding operation without executing software or firmware, but other structures are likewise appropriate.

In some examples, the matrix decompressing circuitry 106 includes means for determining a location of the compressed data. For example, the means for determining may be implemented by data locating circuitry 606. In some examples, the data locating circuitry 606 may be implemented by machine executable instructions such as that implemented by at least block 1306 of FIG. 13 executed by processor circuitry, which may be implemented by the example processor circuitry 1512 of FIG. 15, the example processor circuitry 1600 of FIG. 16, and/or the example Field Programmable Gate Array (FPGA) circuitry 1700 of FIG. 17. In other examples, the data locating circuitry 606 is implemented by other hardware logic circuitry, hardware implemented state machines, and/or any other combination of hardware, software, and/or firmware. For example, the data locating circuitry 606 may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to perform the corresponding operation without executing software or firmware, but other structures are likewise appropriate.

While an example manner of implementing the matrix compressing circuitry 104 of FIG. 1 is illustrated in FIGS. 2 and 3, one or more of the elements, processes, and/or devices illustrated in FIGS. 2 and 3 may be combined, divided, re-arranged, omitted, eliminated, and/or implemented in any other way. Further, the example data transceiver 202, the example pruning circuitry 204, the example compression deciding circuitry 206, the example compressing circuitry 208, the example meta-data generating circuitry 210, the example memory 212, the example compressed data identifying circuitry 302, the example data size determining circuitry 304, the example compression process determining circuitry 306, the example meta-data recording circuitry 308, and/or, more generally, the example matrix compressing circuitry 104 of FIGS. 1, 2 and/or 3, may be implemented by hardware alone or by hardware in combination with software and/or firmware. Thus, for example, any of the example data transceiver 202, the example pruning circuitry 204, the example compression deciding circuitry 206, the example compressing circuitry 208, the example meta-data generating circuitry 210, the example memory 212, the example compressed data identifying circuitry 302, the example data size determining circuitry 304, the example compression process determining circuitry 306, the example meta-data recording circuitry 308, and/or, more generally, the example matrix compressing circuitry 104, could be implemented by processor circuitry, analog circuit(s), digital circuit(s), logic circuit(s), programmable processor(s), programmable microcontroller(s), graphics processing unit(s) (GPU(s)), digital signal processor(s) (DSP(s)), application specific integrated circuit(s) (ASIC (s)), programmable logic device(s) (PLD(s)), and/or field programmable logic device(s) (FPLD(s)) such as Field Programmable Gate Arrays (FPGAs). Further still, the example matrix compressing circuitry 104 of FIGS. 1, 2, and/or 3 may include one or more elements, processes, and/or devices in addition to, or instead of, those illustrated in FIGS. 1, 2, and/or 3, and/or may include more than one of any or all of the illustrated elements, processes, and devices.

While an example manner of implementing the matrix decompressing circuitry 106 of FIG. 1 is illustrated in FIGS. 6, 7, 8, and 10 one or more of the elements, processes, and/or devices illustrated in FIGS. 6, 7, 8, and 10 may be combined, divided, re-arranged, omitted, eliminated, and/or implemented in any other way. Further, the example data transceiver 602, the example bridging circuitry 604, the example data locating circuitry 606, the example data type identifying circuitry 608, the example data size determining circuitry 610, the example compression process determining circuitry 612, the example data decompressing circuitry 614, the example memory 616, the example mapping circuitry 802, and/or, more generally, the example matrix decompressing circuitry 106 of FIGS. 1, 6, 7, 8, and/or 10, may be implemented by hardware alone or hardware in combination with software and/or firmware. Thus, for example, any of the example data transceiver 602, the example bridging circuitry 604, the example data locating circuitry 606, the example data type identifying circuitry 608, the example data size determining circuitry 610, the example compression process determining circuitry 612, the example data decompressing circuitry 614, the example memory 616, the example mapping circuitry 802, and/or, more generally, the example matrix decompressing circuitry 106, could be implemented by processor circuitry, analog circuit(s), digital circuit(s), logic circuit(s), programmable processor(s), programmable microcontroller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)) such as Field Programmable Gate Arrays (FPGAs). Further still, the example matrix decompressing circuitry 106 of FIGS. 1, 6, 7, 8, and/or 10 may include one or more elements, processes, and/or devices in addition to, or instead of, those illustrated in FIGS. 1, 6, 7, 8, and/or 10, and/or may include more than one of any or all of the illustrated elements, processes, and devices.

Figure 11:
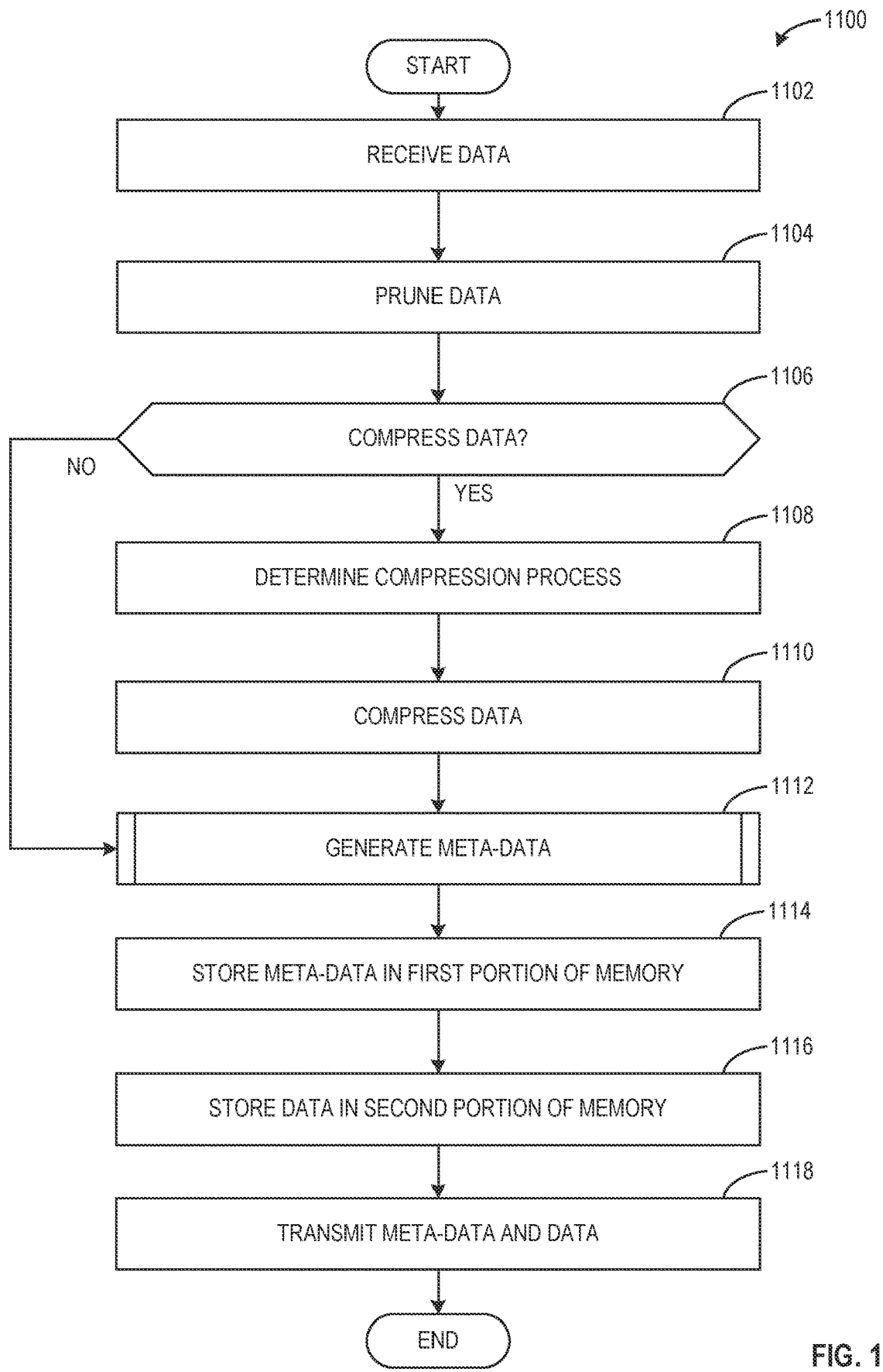
FIG. 11 is a flowchart representative of example machine readable instructions that may be executed by example processor circuitry to implement the example matrix compressing circuitry of FIG. 2.
Figure 12:
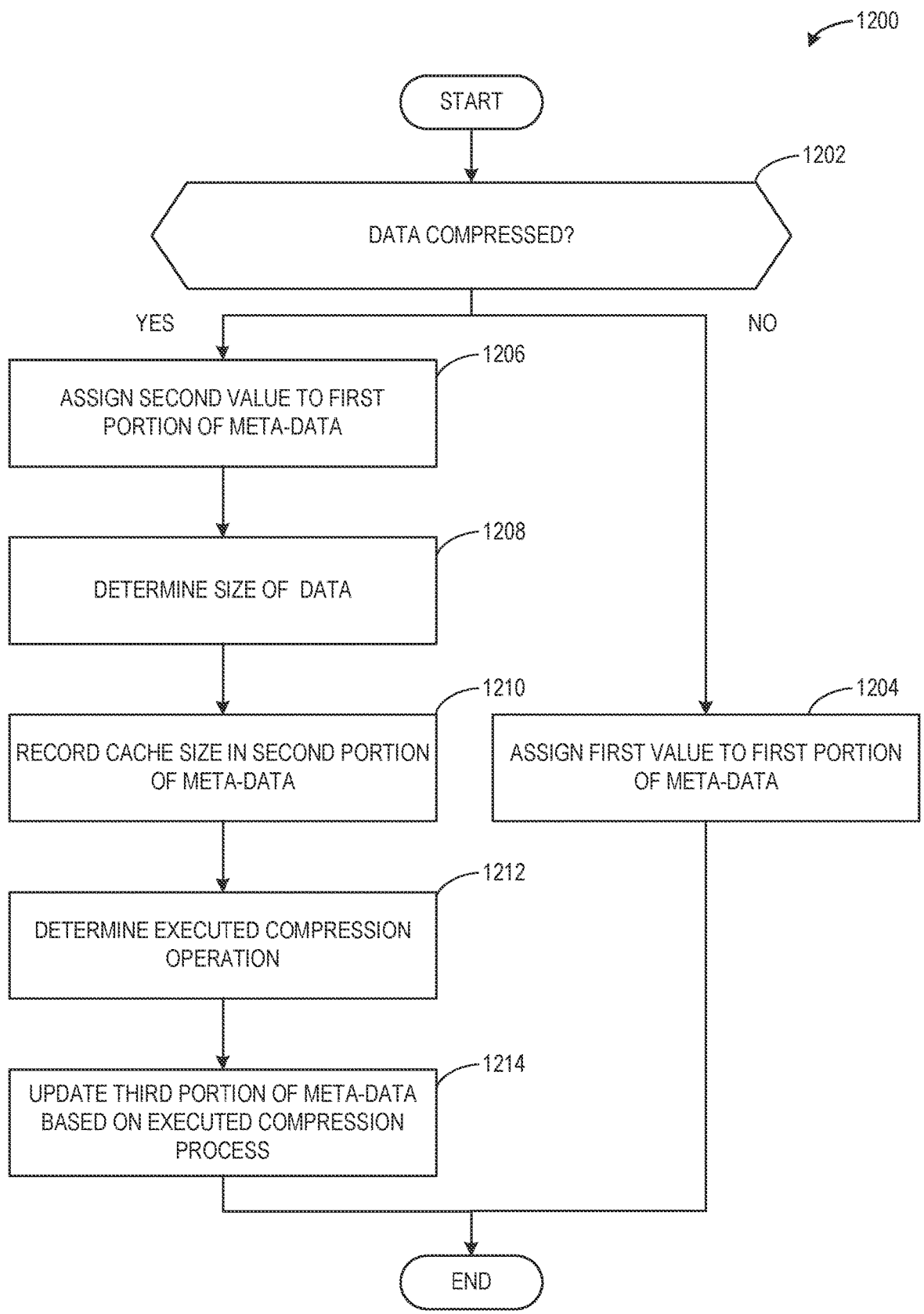
FIG. 12 is a flowchart representative of example machine readable instructions that may be executed by example processor circuitry to implement the example meta-data generating circuitry of FIG. 3.
Figure 13:
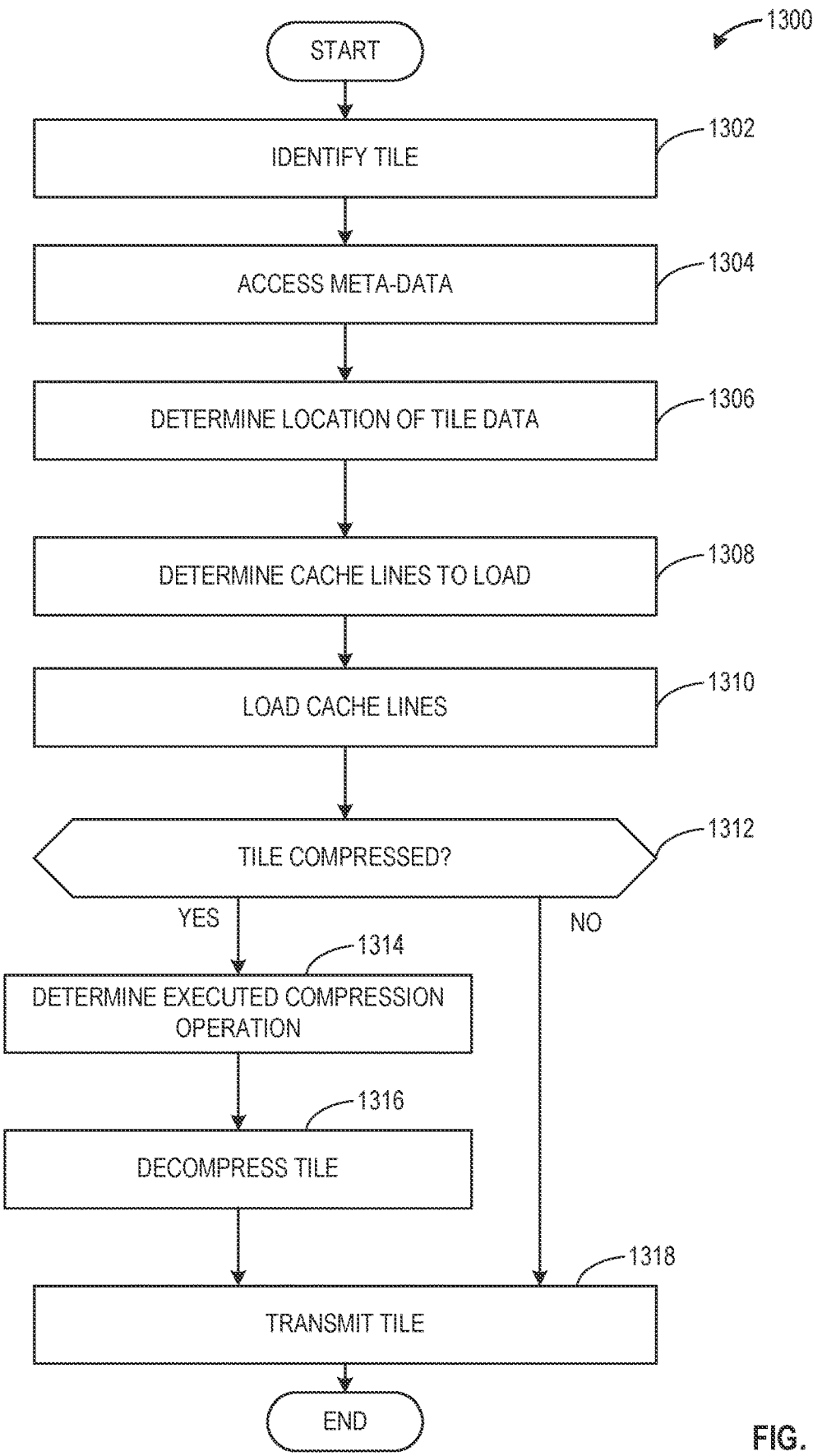
FIG. 13 is a flowchart representative of example machine readable instructions that may be executed by example processor circuitry to implement the example matrix decompressing circuitry of FIG. 6.

Flowcharts representative of example hardware logic circuitry, machine readable instructions, hardware implemented state machines, and/or any combination thereof for implementing the matrix compressing circuitry 104 of FIGS. 1, 2, and/or 3 are shown in FIGS. 11 and 12. A flowchart representative of example hardware logic circuitry, machine readable instructions, hardware implemented state machines, and/or any combination thereof for implementing the matrix decompressing circuitry 106 of FIGS. 1, 6, 7, 8, and/or 10 is shown in FIG. 13. The machine readable instructions may be one or more executable programs or portion(s) of an executable program for execution by processor circuitry, such as the processor circuitry 1412 shown in the example processor platform 1400 discussed below in connection with FIG. 14 and/or the example processor circuitry discussed below in connection with FIGS. 16 and/or 17. The machine readable instructions of FIG. 13 may be one or more executable programs or portion(s) of an executable program for execution by processor circuitry, such as the processor circuitry 1512 shown in the example processor platform 1500 discussed below in connection with FIG. 15 and/or the example processor circuitry discussed below in connection with FIGS. 16 and/or 17. The program may be embodied in software stored on one or more non-transitory computer readable storage media such as a CD, a floppy disk, a hard disk drive (HDD), a DVD, a Blu-ray disk, a volatile memory (e.g., Random Access Memory (RAM) of any type, etc.), or a non-volatile memory (e.g., FLASH memory, an HDD, etc.) associated with processor circuitry located in one or more hardware devices, but the entire program and/or parts thereof could alternatively be executed by one or more hardware devices other than the processor circuitry and/or embodied in firmware or dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN) gateway that may facilitate communication between a server and an endpoint client hardware device). Similarly, the non-transitory computer readable storage media may include one or more mediums located in one or more hardware devices. Further, although the example program is described with reference to the flowchart illustrated in FIGS. 11, 12, and 13 many other methods of implementing the example matrix compressing circuitry 104 and/or the matrix decompressing circuitry 106 may alternatively be used. For example, the order of execution of the blocks may be changed, and/or some of the blocks described may be changed, eliminated, or combined. Additionally or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU), etc.) in a single machine, multiple processors distributed across multiple servers of a server rack, multiple processors distributed across one or more server racks, a CPU and/or a FPGA located in the same package (e.g., the same integrated circuit (IC) package or in two or more separate housings, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., as portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of machine executable instructions that implement one or more operations that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc., in order to execute the machine readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 11, 12, and 13 may be implemented using executable instructions (e.g., computer and/or machine readable instructions) stored on one or more non-transitory computer and/or machine readable media such as optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms non-transitory computer readable medium and non-transitory computer readable storage medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

FIG. 11 is a flowchart representative of example machine readable instructions and/or example operations 400 that may be executed and/or instantiated by processor circuitry to implement the matrix compressing circuitry 104 of FIGS. 1, 2, and/or 3 to compress tiles of neural network weights. The machine readable instructions and/or operations 1100 of FIG. 11 begin at block 1102, at which the matrix compressing circuitry 104 receives uncompressed data (e.g., tiles of neural network weights). For example, the data transceiver 202 (FIG. 2) can receive the tiles of neural network weights from the neural network circuitry 102 via the bus 108.

At block 1104, the matrix compressing circuitry 104 prunes the data (e.g., a tile of neural network weights). For example, the pruning circuitry 204 (FIG. 2) can prune the data. Specifically, the pruning circuitry 204 converts the uncompressed data to partially compressed data by removing weights below a certain threshold.

At block 1106, the matrix compressing circuitry 104 determines whether to compress data. For example, the compression deciding circuitry 206 (FIG. 2) determines whether to compress the data. In some examples, the compression deciding circuitry 206 determines whether to compress the data based on a quantity or percentage of bytes in the data having a value of zero. For example, the compression deciding circuitry 206 can determine whether the quantity or percentage of bytes in the data having a value of zero satisfies (e.g., is greater than) a threshold. Specifically, a greater quantity or percentage of bytes having a value of zero enables a greater amount of space savings in response to being compressed. In turn, the compression deciding circuitry 206 can determine the threshold based on a quantity or percentage of bytes that would enable the data to occupy fewer cache lines than the uncompressed data in response to having a value of zero. In some examples, the compression deciding circuitry 206 transmits a first signal to the meta-data generating circuitry 210 (FIGS. 2 and 3) indicative of the data being compressed in response to determining the data is to be compressed. In some examples, the compression deciding circuitry 206 transmits a second signal to the meta-data generating circuitry 210 indicative of the data remaining uncompressed in response to determining the data is to remain uncompressed. In response to the compression deciding circuitry 206 deciding to compress the data, the operations 1100 proceed to block 1108. Otherwise, the operations 1100 skip to block 1112.

At block 1108, the matrix compression circuitry 104 determines a compression process to execute. For example, the compression deciding circuitry 206 can determine the compression process to execute based on a quantity or percentage of bytes in the data non-zero values. In some examples, the compression deciding circuitry 206 determines that a first compression process (e.g., "zero compression") is to be executed in response to the data having at least one byte having a non-zero value. In some examples, the compression deciding circuitry 206 determines a second compression process (e.g., "all zero" compression) to be executed in response to all bytes in the data having a value of zero. In some examples, the compression deciding circuitry 206 transmits a signal to the meta-data generating circuitry 210 indicative of the compression process to be executed.

At block 1110, the matrix compressing circuitry 104 compresses the data. For example, the compressing circuitry 208 (FIG. 2) can execute a compression operation based on the compression operation determined by the compression deciding circuitry 206. In some examples, to execute the "zero compression" operation, the compressing circuitry 208 generates a bitmap (e.g., the bitmap 408 of FIG. 4) indicative of locations of bytes having non-zero values in the data and packs the non-zero values in a compressed tile (e.g., the compressed tile 410 of FIG. 4). In some examples, to execute the "all zero" compression operation, the compressing circuitry 208 compresses the data to one byte having a value of zero. In some examples, the compressing circuitry 208 transmits the data to the meta-data generating circuitry 210 in response to compressing the data.

At block 1112, the matrix compressing circuitry 104 generates meta-data. For example, the meta-data generating circuitry 210 can generate a byte of meta-data based on whether the data is compressed, the executed compression operation, and a size of the data in response to being compressed, as discussed further in association with FIG. 12.

At block 1114, the matrix compressing circuitry 104 stores the meta-data in a first portion of the memory 212 (FIG. 2). For example, the meta-data generating circuitry 210 can store the meta-data in a first cache line of the memory 212 (FIG. 2). Specifically, the meta-data generating circuitry 210 can store meta-data for sixty-four tiles in the first cache line of the memory 212.

At block 1116, the matrix compressing circuitry 104 stores the data in a second portion of the memory 212. For example, the compressing circuitry 208 can store the data in the cache lines of the memory following the first cache line.

At block 1118, the matrix compressing circuitry 104 transmits the data and the meta-data to the matrix decompressing circuitry 106 (FIGS. 1, 6, 7, 8, and/or 10). For example, the data transceiver 202 can transmit the data and the meta-data to the matrix decompressing circuitry 106. In some examples, the data transceiver 202 transmits the data and the meta-data in a format stored in the memory.

FIG. 12 is a flowchart representative of example machine readable instructions and/or example operations that may be executed and/or instantiated by processor circuitry to implement the meta-data generating circuitry 210 of FIGS. 2 and 3 to generate meta-data for respective tiles of neural network weights. The machine readable instructions and/or operations 1200 of FIG. 12 begin at block 1202, at which the meta-data generating circuitry 210 determines whether the data is compressed. For example, the compressed data identifying circuitry 302 (FIG. 3) can determine whether the data is compressed based on a signal received from the compression deciding circuitry 206 (FIG. 2). Specifically, the compressed data identifying circuitry 302 can determine the data is compressed in response to receiving a first signal. Conversely, the compressed data identifying circuitry 302 can determine the data is uncompressed in response to receiving a second signal. In some examples, the compressed data identifying circuitry 302 determines the data is compressed in response to receiving the data from the compressing circuitry 208 (FIG. 2). In response to the compressed data identifying circuitry 302 determining the data is compressed, the operations 1300 proceed to block 1204. In response to the compressed data identifying circuitry 302 determining the data is uncompressed, the operations 1300 proceed to block 1206.

At block 1204, the meta-data generating circuitry 210 assigns a first value to a first portion of the meta-data. For example, the meta-data recording circuitry 308 (FIG. 3) can record the first value (e.g., 0) in a first bit of the meta-data.

At block 1206, the meta-data generating circuitry 210 assigns a second value to the first portion of the meta-data. For example, the meta-data recording circuitry 308 can record the second value (e.g., 1) in the first bit of the meta-data.

At block 1208, the meta-data generating circuitry 210 determines a size of the data. For example, the data size determining circuitry 304 (FIG. 3) can determine a cache size of the data. In some examples, the data size determining circuitry 304 determines a quantity of cache lines occupied by the data.

At block 1210, the meta-data generating circuitry 210 records the size of the data in a second portion of the meta-data. For example, the meta-data recording circuitry 308 can configure four bits of the meta-data adjacent to the first bit to indicate the quantity of cache lines occupied by the data.

At block 1212, the meta-data generating circuitry 210 determines a compression operation executed to obtain the data. For example, the compression process determining circuitry 306 can determine the compression operation based on a signal received from the compression deciding circuitry 206. In some examples, the compression process determining circuitry 306 analyzes a format of the data to determine the compression operation. For example, the compression process determining circuitry 306 can determine the data was compressed via a "zero compression" operation in response to identifying a bitmap or a compressed tile. In some examples, the compression process determining circuitry 306 determines the data was compressed via an "all zero" compression operation in response to identifying that the data includes a single byte having a value of zero.

At block 1214, the meta-data generating circuitry 210 updates a third portion of the meta-data based on the executed compression operation. For example, the meta-data recording circuitry 308 can assign a value corresponding to the executed compression operation to a last three bits of the meta-data.

FIG. 13 is a flowchart representative of example machine readable instructions and/or example operations 1300 that may be executed and/or instantiated by processor circuitry to implement the matrix decompressing circuitry 106 of FIGS. 1, 6, 7, 8, and/or 10 to decompress data corresponding to tiles of neural network weights. The machine readable instructions and/or operations 1300 of FIG. 13 begin at block 1302, at which the matrix decompressing circuitry 106 identifies a tile to load. For example, the data transceiver 602 (FIG. 6) can receive a signal indicative of the tile from the neural network circuitry 102 (FIG. 1) via the bus 108 (FIGS. 1, 2, and 6). In some examples, the data transceiver 602 receives an address of the tile indicative of a location (e.g., an address) of the tile respective to other tiles in an associated tile array.

At block 1304, the matrix decompressing circuitry 106 accesses meta-data (e.g., the meta-data 402 of FIG. 4) associated with the tile. For example, bridging circuitry 604 (FIG. 6) can correlate the address of the tile with the byte of meta-data associated with the tile. Specifically, in response to the tile being the third tile in the tile array, the bridging circuitry can access a third byte in a meta-data cache line (e.g., the meta-data cache line 502 of FIG. 5) stored in the memory 616 (FIG. 6) to access the meta-data associated with the tile.

At block 1306, the matrix decompressing circuitry 106 determines a location of data associated with the tile. For example, the data locating circuitry 606 can analyze meta-data positioned in front of the meta-data associated with the tile in the meta-data cache line to determine a quantity of cache lines occupied by the preceding tiles in the memory 616. In turn, the data locating circuitry 606 can determine an offset of an initial cache line of the data associated with the tile.

At block 1308, the matrix decompressing circuitry 106 determines cache lines to load. For example, the data size determining circuitry 610 can determine a quantity of cache lines associated with the tile based on a portion of the meta-data associated with the tile. In some examples, the data size determining circuitry 610 determines the quantity of cache lines to load corresponds to a quantity of cache lines occupied by an uncompressed tile in response a first portion of the meta-data (e.g., the first portion 406 of the meta-data 402 of FIG. 4) including a first value (e.g., 0). In some examples, in response to the first portion of the meta-data including a second value (e.g., 1) the data size determining circuitry 610 determines the quantity of cache lines to load based on a second portion of the meta-data (e.g., the third portion 416 of the meta-data 402 of FIG. 4).

At block 1310, the matrix decompressing circuitry 106 loads the cache lines associated with the tile. For example, the data decompressing circuitry 614 (FIG. 6) can load the uncompressed tile from the memory 616 based on the determined location of the tile and the quantity of cache lines occupied by the tile.

At block 1312, the matrix decompressing circuitry 106 determines whether the tile is compressed. For example, the data type identifying circuitry 608 (FIG. 6) can determine the tile is uncompressed in response to the first portion of the meta-data including the first value. Conversely, the data type identifying circuitry 608 can determine the tile is compressed in response to the first portion of the meta-data including the second value. In response to the tile being compressed, the example operations 1300 proceed to block 1314. In response to the tile being uncompressed, the example operations 1300 proceed to block 1318.

At block 1314, the matrix decompressing circuitry 106 determines an operation executed to compress the tile. For example, the compression process determining circuitry 612 can determine the compression process executed by the matrix compressing circuitry 104 in the example operations 1100 of FIG. 11 based on a third portion of the meta-data (e.g., the second portion 414 of the meta-data of FIG. 4) associated with the tile. In some examples, the compression process determining circuitry 612 correlates a value of the third portion of the meta-data with an associated compression operation to determine the executed compression operation. For example, the compression process determining circuitry 612 can determine a first compression operation (e.g., "zero compression") was executed to obtain the tile in response to the third portion of the meta-data including a first value. Similarly the compression process determining circuitry 612 can determine a second compression operation (e.g., "all zero") was executed to obtain the tile in response to the third portion of the meta-data including a second value.

At block 1316, the matrix decompressing circuitry 106 decompresses the tile. For example, the data decompressing circuitry 614 can decompress the tile based on the operation executed to compress the tile.

At block 1318, matrix decompressing circuitry 106 transmits the tile to the neural network circuitry 102 (FIG. 1). For example, the data transceiver 602 can transmit the tile to the neural network circuitry 102 via the bus 108. Accordingly, the neural network circuitry 102 can utilize the tile to perform an inference based on an input.

Figure 14:
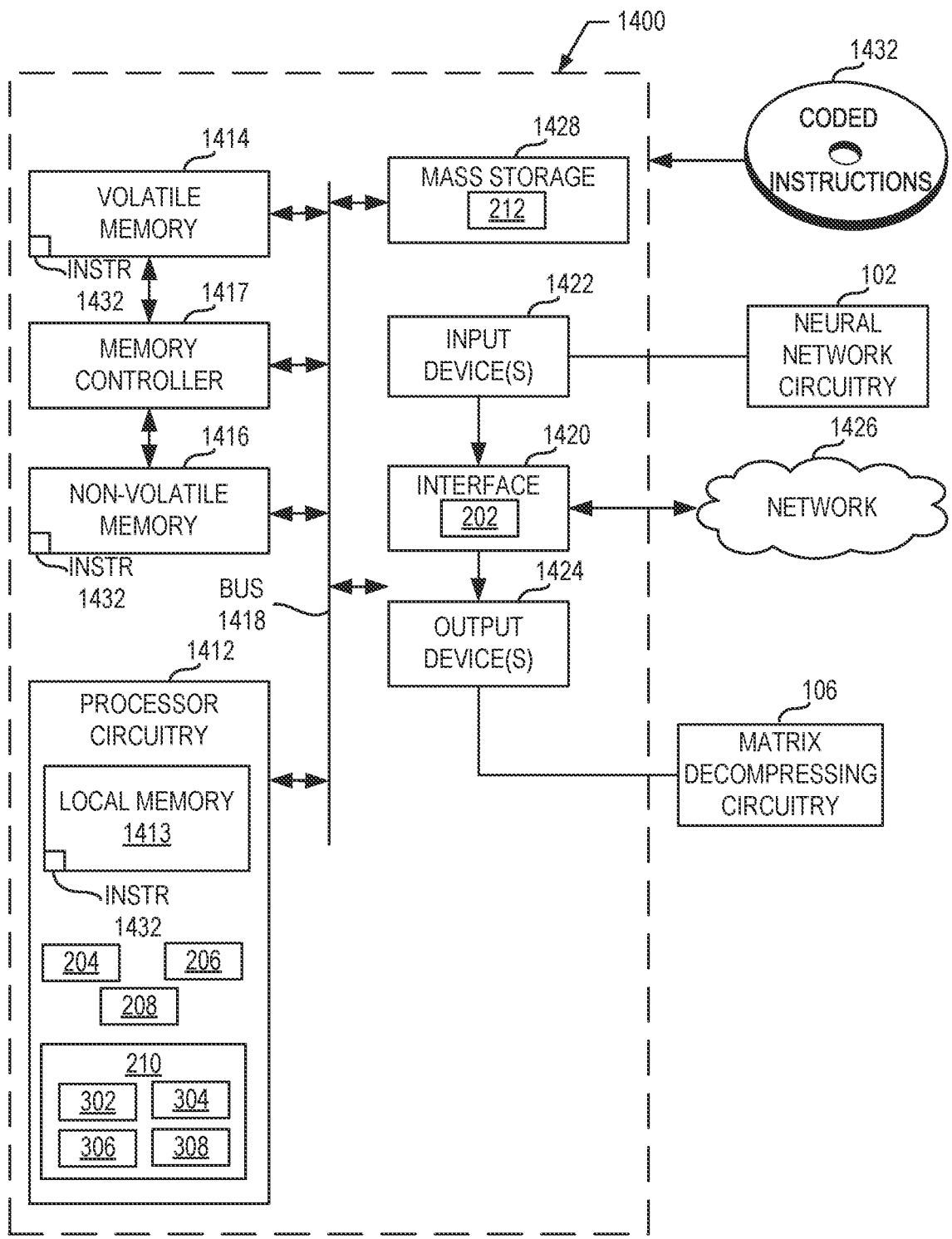
FIG. 14 is a block diagram of an example processing platform including processor circuitry structured to execute the example machine readable instructions of FIGS. 11 and 12 to implement the example matrix compressing circuitry of FIG. 2.

FIG. 14 is a block diagram of an example processor platform 1400 structured to execute and/or instantiate the machine readable instructions and/or operations of FIGS. 11 and 12 to implement the matrix compressing circuitry 104 of FIGS. 1, 2, and 3. The processor platform 1400 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, or any other type of computing device.

The processor platform 1400 of the illustrated example includes processor circuitry 1412. The processor circuitry 1412 of the illustrated example is hardware. For example, the processor circuitry 1412 can be implemented by one or more integrated circuits, logic circuits, FPGAs microprocessors, CPUs, GPUs, DSPs, and/or microcontrollers from any desired family or manufacturer. The processor circuitry 1412 may be implemented by one or more semiconductor based (e.g., silicon based) devices. In this example, the processor circuitry 1412 implements the matrix compressing circuitry 104, the pruning circuitry 204, the compression deciding circuitry 206, the compressing circuitry 208, the meta-data generating circuitry 210, the compressed data identifying circuitry 302, the data size determining circuitry 304, the compression process determining circuitry 306, and the meta-data recording circuitry 308.

The processor circuitry 1412 of the illustrated example includes a local memory 1413 (e.g., a cache, registers, etc.). The processor circuitry 1412 of the illustrated example is in communication with a main memory including a volatile memory 1414 and a non-volatile memory 1416 by a bus 1418. The volatile memory 1414 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1416 may be implemented by flash memory and/or any other desired type of memory device. Access to the main memory 1414, 1416 of the illustrated example is controlled by a memory controller 1417.

The processor platform 1400 of the illustrated example also includes interface circuitry 1420. The interface circuitry 1420 may be implemented by hardware in accordance with any type of interface standard, such as an Ethernet interface, a universal serial bus (USB) interface, a Bluetooth® interface, a near field communication (NFC) interface, a PCI interface, and/or a PCIe interface. In this example, the interface circuitry 1420 implements the data transceiver 202.

In the illustrated example, one or more input devices 1422 are connected to the interface circuitry 1420. The input device(s) 1422 permit(s) a user to enter data and/or commands into the processor circuitry 1412. The input device(s) 1422 can be implemented by, for example, an audio sensor, a microphone, a camera (still or video), a keyboard, a button, a mouse, a touchscreen, a track-pad, a trackball, an isopoint device, and/or a voice recognition system.

One or more output devices 1424 are also connected to the interface circuitry 1420 of the illustrated example. The output devices 1424 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 1420 of the illustrated example, thus, typically includes a graphics driver card, a graphics driver chip, and/or graphics processor circuitry such as a GPU.

The interface circuitry 1420 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1426. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 1400 of the illustrated example also includes one or more mass storage devices 1428 to store software and/or data. Examples of such mass storage devices 1428 include magnetic storage devices, optical storage devices, floppy disk drives, HDDs, CDs, Blu-ray disk drives, redundant array of independent disks (RAID) systems, solid state storage devices such as flash memory devices, and DVD drives.

The machine executable instructions 1432, which may be implemented by the machine readable instructions of FIGS. 11 and 12, may be stored in the mass storage device 1428, in the volatile memory 1414, in the non-volatile memory 1416, and/or on a removable non-transitory computer readable storage medium such as a CD or DVD.

Figure 15:
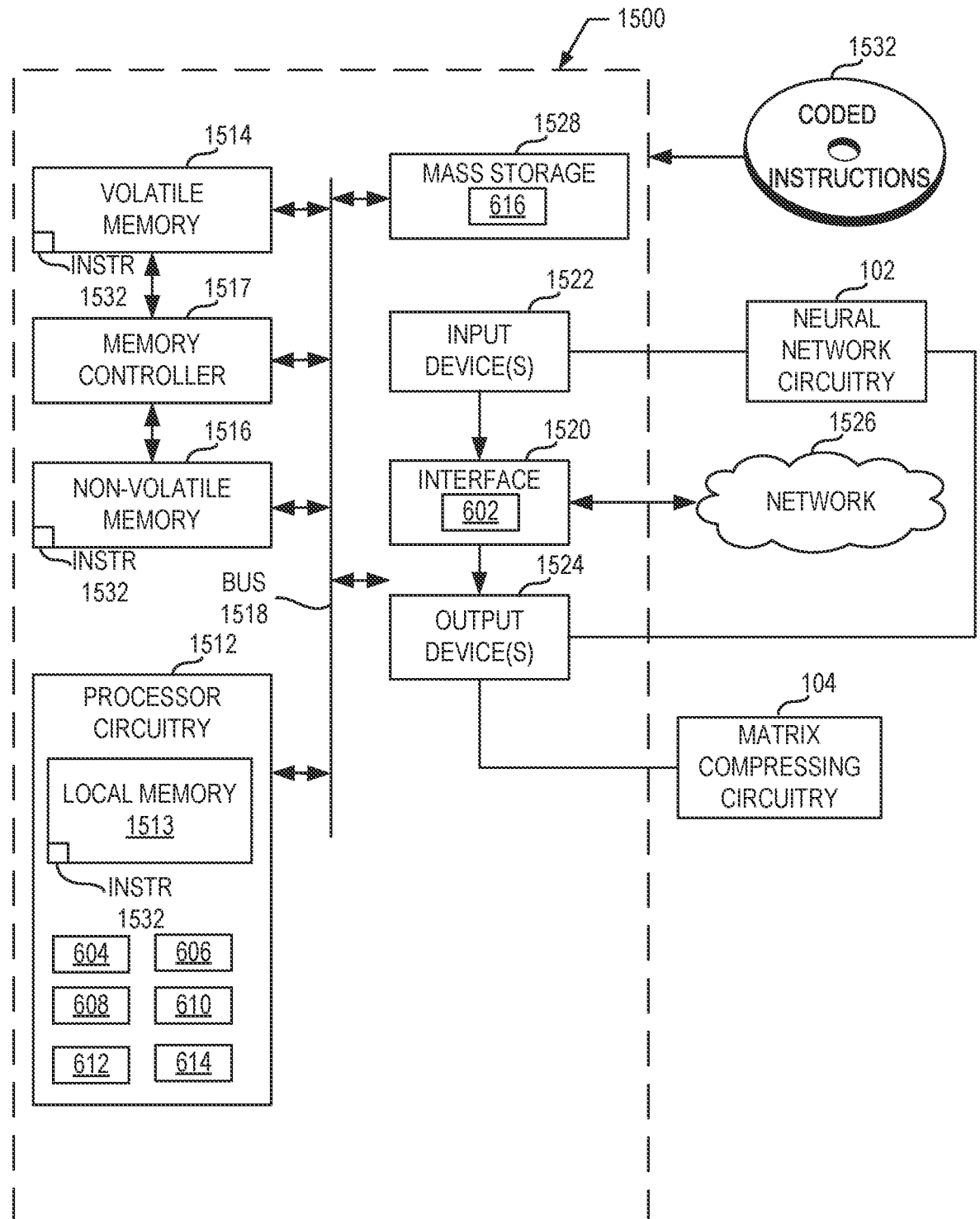
FIG. 15 is a block diagram of an example processing platform including processor circuitry structured to execute the example machine readable instructions of FIG. 13 to implement the example matrix decompressing circuitry of FIG. 6.

FIG. 15 is a block diagram of an example processor platform 1500 structured to execute and/or instantiate the machine readable instructions and/or operations of FIG. 13 to implement the matrix decompressing circuitry 106 of FIGS. 1, 6, 7, 8, and 10. The processor platform 1500 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, or any other type of computing device.

The processor platform 1500 of the illustrated example includes processor circuitry 1512. The processor circuitry 1512 of the illustrated example is hardware. For example, the processor circuitry 1512 can be implemented by one or more integrated circuits, logic circuits, FPGAs microprocessors, CPUs, GPUs, DSPs, and/or microcontrollers from any desired family or manufacturer. The processor circuitry 1512 may be implemented by one or more semiconductor based (e.g., silicon based) devices. In this example, the processor circuitry 1512 implements the bridging circuitry 604, the data locating circuitry 606, the data type identifying circuitry 608, the data size determining circuitry 610, the compression process determining circuitry 612, and the data decompressing circuitry 614.

The processor circuitry 1512 of the illustrated example includes a local memory 1513 (e.g., a cache, registers, etc.). The processor circuitry 1512 of the illustrated example is in communication with a main memory including a volatile memory 1514 and a non-volatile memory 1516 by a bus 1518. The volatile memory 1514 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1516 may be implemented by flash memory and/or any other desired type of memory device. Access to the main memory 1514, 1516 of the illustrated example is controlled by a memory controller 1517.

The processor platform 1500 of the illustrated example also includes interface circuitry 1520. The interface circuitry 1520 may be implemented by hardware in accordance with any type of interface standard, such as an Ethernet interface, a universal serial bus (USB) interface, a Bluetooth® interface, a near field communication (NFC) interface, a PCI interface, and/or a PCIe interface. In this example, the interface circuitry 1520 implements the data transceiver 602.

In the illustrated example, one or more input devices 1522 are connected to the interface circuitry 1520. The input device(s) 1522 permit(s) a user to enter data and/or commands into the processor circuitry 1512. The input device(s) 1522 can be implemented by, for example, an audio sensor, a microphone, a camera (still or video), a keyboard, a button, a mouse, a touchscreen, a track-pad, a trackball, an isopoint device, and/or a voice recognition system.

One or more output devices 1524 are also connected to the interface circuitry 1520 of the illustrated example. The output devices 1524 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 1520 of the illustrated example, thus, typically includes a graphics driver card, a graphics driver chip, and/or graphics processor circuitry such as a GPU.

The interface circuitry 1520 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1526. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 1500 of the illustrated example also includes one or more mass storage devices 1528 to store software and/or data. Examples of such mass storage devices 1528 include magnetic storage devices, optical storage devices, floppy disk drives, HDDs, CDs, Blu-ray disk drives, redundant array of independent disks (RAID) systems, solid state storage devices such as flash memory devices, and DVD drives.

The machine executable instructions 1532, which may be implemented by the machine readable instructions of FIG. 13, may be stored in the mass storage device 1528, in the volatile memory 1514, in the non-volatile memory 1516, and/or on a removable non-transitory computer readable storage medium such as a CD or DVD.

Figure 16:
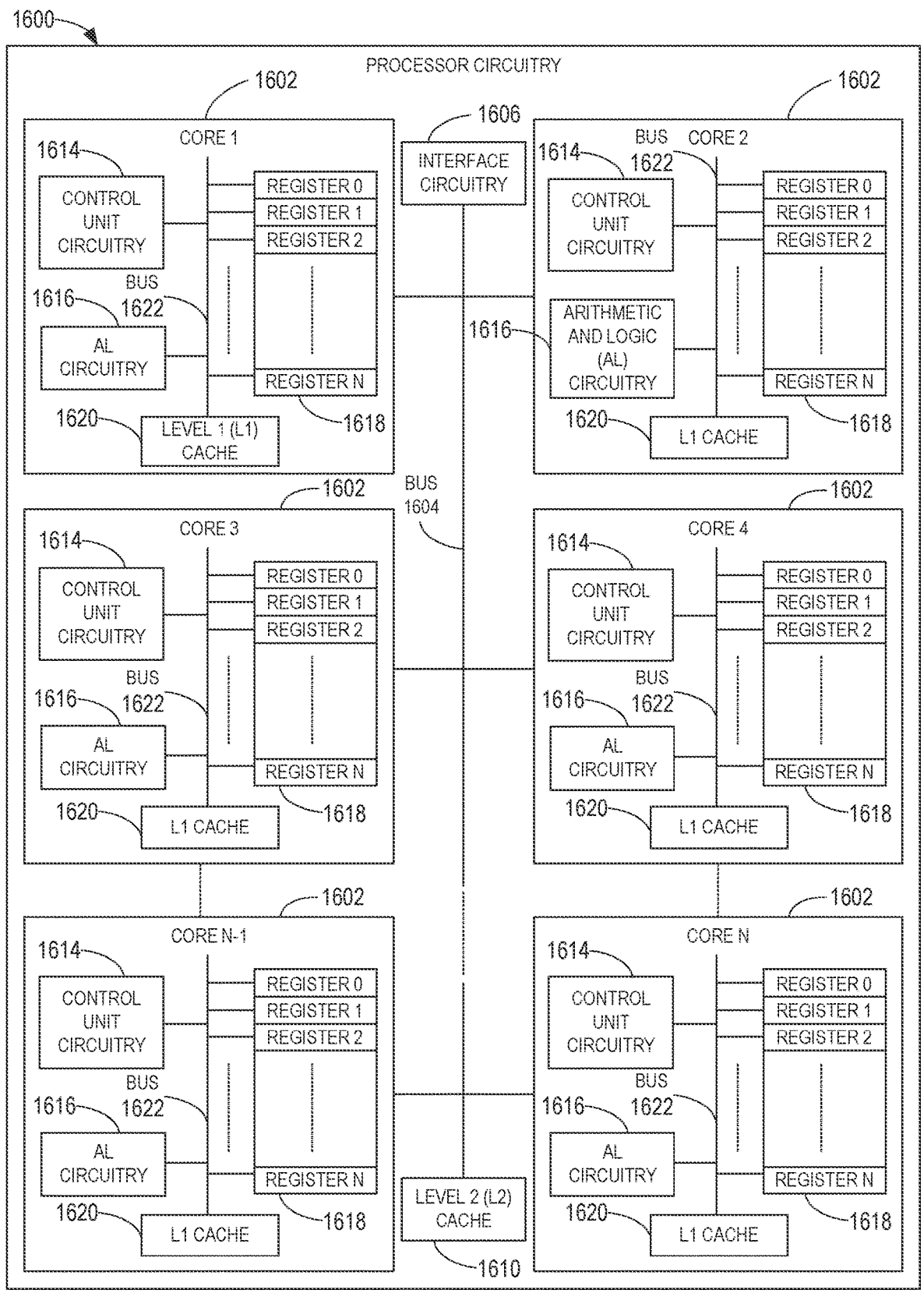
FIG. 16 is a block diagram of an example implementation of the processor circuitry of FIGS. 14 and 15.

FIG. 16 is a block diagram of an example implementation of the processor circuitry 1412 of FIG. 14 and/or 1512 of FIG. 15. In this example, the processor circuitry 1412 of FIG. 14 and/or 1512 of FIG. 15 is implemented by a microprocessor 1600. For example, the microprocessor 1600 may implement multi-core hardware circuitry such as a CPU, a DSP, a GPU, an XPU, etc. Although it may include any number of example cores 1602 (e.g., 1 core), the microprocessor 1600 of this example is a multi-core semiconductor device including N cores. The cores 1602 of the microprocessor 1600 may operate independently or may cooperate to execute machine readable instructions. For example, machine code corresponding to a firmware program, an embedded software program, or a software program may be executed by one of the cores 1602 or may be executed by multiple ones of the cores 1602 at the same or different times. In some examples, the machine code corresponding to the firmware program, the embedded software program, or the software program is split into threads and executed in parallel by two or more of the cores 1602. The software program may correspond to a portion or all of the machine readable instructions and/or operations represented by the flowcharts of FIGS. 11, 12, and/or 13.

The cores 1602 may communicate by an example bus 1604. In some examples, the bus 1604 may implement a communication bus to effectuate communication associated with one(s) of the cores 1602. For example, the bus 1604 may implement at least one of an Inter-Integrated Circuit (I2C) bus, a Serial Peripheral Interface (SPI) bus, a PCI bus, or a PCIe bus. Additionally or alternatively, the bus 1604 may implement any other type of computing or electrical bus. The cores 1602 may obtain data, instructions, and/or signals from one or more external devices by example interface circuitry 1606. The cores 1602 may output data, instructions, and/or signals to the one or more external devices by the interface circuitry 1606. Although the cores 1602 of this example include example local memory 1620 (e.g., Level 1 (L1) cache that may be split into an L1 data cache and an L1 instruction cache), the microprocessor 1600 also includes example shared memory 1610 that may be shared by the cores (e.g., Level 2 (L2_cache)) for high-speed access to data and/or instructions. Data and/or instructions may be transferred (e.g., shared) by writing to and/or reading from the shared memory 1610. The local memory 1620 of each of the cores 1602 and the shared memory 1610 may be part of a hierarchy of storage devices including multiple levels of cache memory and the main memory (e.g., the main memory 1414, 1416 of FIG. 14, the main memory 1514, 1516 of FIG. 15). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 1602 may be referred to as a CPU, DSP, GPU, etc., or any other type of hardware circuitry. Each core 1602 includes control unit circuitry 1614, arithmetic and logic (AL) circuitry (sometimes referred to as an ALU) 1616, a plurality of registers 1618, the L1 cache 1620, and an example bus 1622. Other structures may be present. For example, each core 1602 may include vector unit circuitry, single instruction multiple data (SIMD) unit circuitry, load/store unit (LSU) circuitry, branch/jump unit circuitry, floating-point unit (FPU) circuitry, etc. The control unit circuitry 1614 includes semiconductor-based circuits structured to control (e.g., coordinate) data movement within the corresponding core 1602. The AL circuitry 1616 includes semiconductor-based circuits structured to perform one or more mathematic and/or logic operations on the data within the corresponding core 1602. The AL circuitry 1616 of some examples performs integer based operations. In other examples, the AL circuitry 1616 also performs floating point operations. In yet other examples, the AL circuitry 1616 may include first AL circuitry that performs integer based operations and second AL circuitry that performs floating point operations. In some examples, the AL circuitry 1616 may be referred to as an Arithmetic Logic Unit (ALU). The registers 1618 are semiconductor-based structures to store data and/or instructions such as results of one or more of the operations performed by the AL circuitry 1616 of the corresponding core 1602. For example, the registers 1618 may include vector register(s), SIMD register(s), general purpose register(s), flag register(s), segment register(s), machine specific register(s), instruction pointer register(s), control register(s), debug register(s), memory management register(s), machine check register(s), etc. The registers 1618 may be arranged in a bank as shown in FIG. 16. Alternatively, the registers 1618 may be organized in any other arrangement, format, or structure including distributed throughout the core 1602 to shorten access time. The bus 1604 may implement at least one of an I2C bus, a SPI bus, a PCI bus, or a PCIe bus Each core 1602 and/or, more generally, the microprocessor 1600 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 1600 is a semiconductor device fabricated to include many transistors interconnected to implement the structures described above in one or more integrated circuits (ICs) contained in one or more packages. The processor circuitry may include and/or cooperate with one or more accelerators. In some examples, accelerators are implemented by logic circuitry to perform certain tasks more quickly and/or efficiently than can be done by a general purpose processor. Examples of accelerators include ASICs and FPGAs such as those discussed herein. A GPU or other programmable device can also be an accelerator. Accelerators may be on-board the processor circuitry, in the same chip package as the processor circuitry and/or in one or more separate packages from the processor circuitry.

Figure 17:
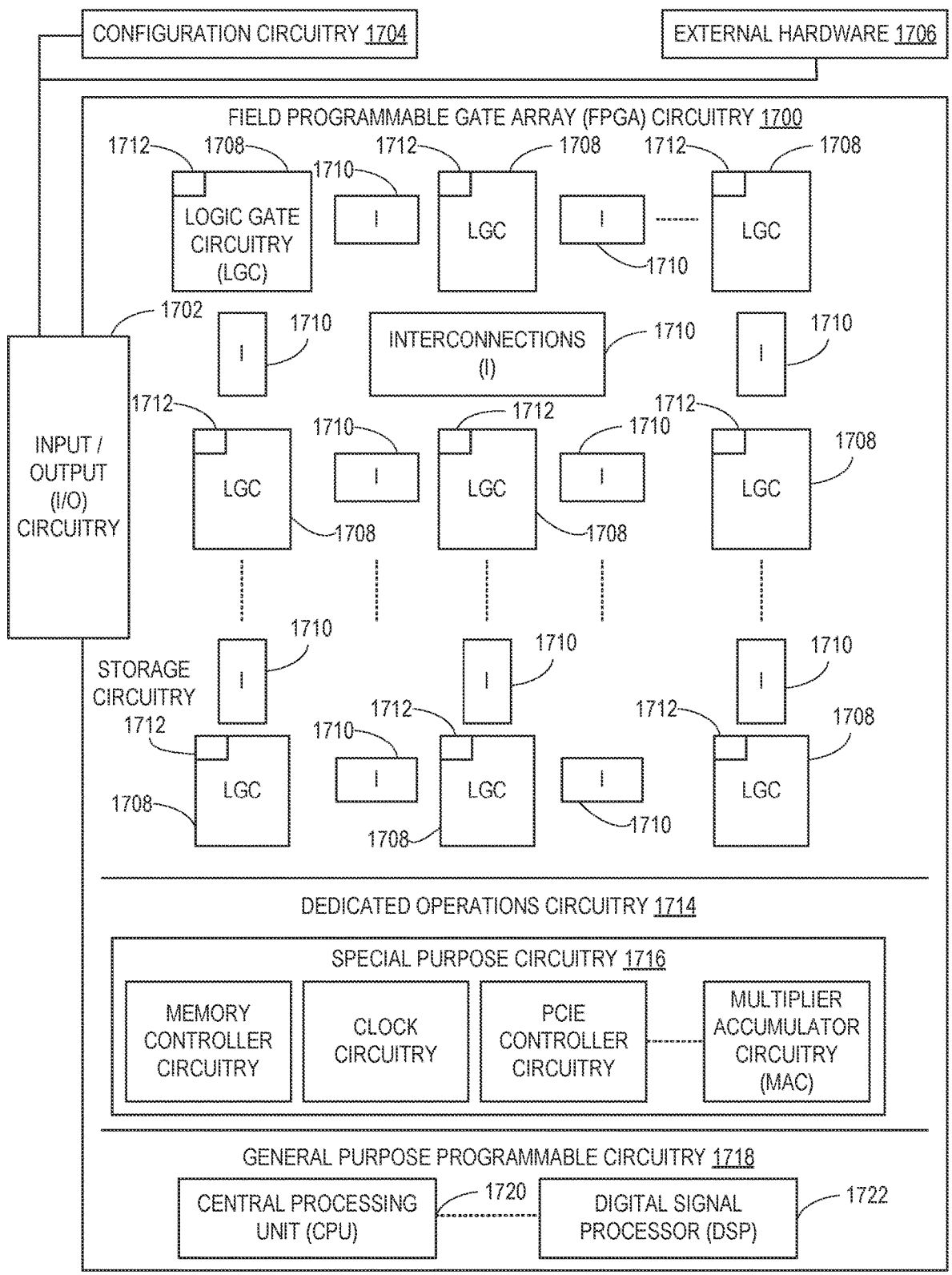
FIG. 17 is a block diagram of another example implementation of the processor circuitry of FIGS. 14 and 15.

FIG. 17 is a block diagram of another example implementation of the processor circuitry 1412 of FIG. 14 and/or the processor circuitry 1512 of FIG. 15. In this example, the processor circuitry 1412 and/or the processor circuitry 1512 is implemented by FPGA circuitry 1700. The FPGA circuitry 1700 can be used, for example, to perform operations that could otherwise be performed by the example microprocessor 1600 of FIG. 16 executing corresponding machine readable instructions. However, once configured, the FPGA circuitry 1700 instantiates the machine readable instructions in hardware and, thus, can often execute the operations faster than they could be performed by a general purpose microprocessor executing the corresponding software.

More specifically, in contrast to the microprocessor 1600 of FIG. 16 described above (which is a general purpose device that may be programmed to execute some or all of the machine readable instructions represented by the flowcharts of FIGS. 11, 12, and 13 but whose interconnections and logic circuitry are fixed once fabricated), the FPGA circuitry 1700 of the example of FIG. 6 includes interconnections and logic circuitry that may be configured and/or interconnected in different ways after fabrication to instantiate, for example, some or all of the machine readable instructions represented by the flowcharts of FIGS. 11, 12, and 13. In particular, the FPGA 1700 may be thought of as an array of logic gates, interconnections, and switches. The switches can be programmed to change how the logic gates are interconnected by the interconnections, effectively forming one or more dedicated logic circuits (unless and until the FPGA circuitry 1700 is reprogrammed). The configured logic circuits enable the logic gates to cooperate in different ways to perform different operations on data received by input circuitry. Those operations may correspond to some or all of the software represented by the flowcharts of FIGS. 11, 12, and 13. As such, the FPGA circuitry 1700 may be structured to effectively instantiate some or all of the machine readable instructions of the flowcharts of FIGS. 11, 12, and 13 as dedicated logic circuits to perform the operations corresponding to those software instructions in a dedicated manner analogous to an ASIC. Therefore, the FPGA circuitry 1700 may perform the operations corresponding to the some or all of the machine readable instructions of FIG. 17 faster than the general purpose microprocessor can execute the same.

In the example of FIG. 17, the FPGA circuitry 1700 is structured to be programmed (and/or reprogrammed one or more times) by an end user by a hardware description language (HDL) such as Verilog. The FPGA circuitry 1700 of FIG. 17, includes example input/output (I/O) circuitry 1702 to obtain and/or output data to/from example configuration circuitry 1704 and/or external hardware (e.g., external hardware circuitry) 1706. For example, the configuration circuitry 1704 may implement interface circuitry that may obtain machine readable instructions to configure the FPGA circuitry 1700, or portion(s) thereof. In some such examples, the configuration circuitry 1704 may obtain the machine readable instructions from a user, a machine (e.g., hardware circuitry (e.g., programmed or dedicated circuitry) that may implement an Artificial Intelligence/Machine Learning (AI/ML) model to generate the instructions), etc. In some examples, the external hardware 1706 may implement the microprocessor 1600 of FIG. 16. The FPGA circuitry 1700 also includes an array of example logic gate circuitry 1708, a plurality of example configurable interconnections 1710, and example storage circuitry 1712. The logic gate circuitry 1708 and interconnections 1710 are configurable to instantiate one or more operations that may correspond to at least some of the machine readable instructions of FIG. 17 and/or other desired operations. The logic gate circuitry 1708 shown in FIG. 17 is fabricated in groups or blocks. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 1708 to enable configuration of the electrical structures and/or the logic gates to form circuits to perform desired operations. The logic gate circuitry 1708 may include other electrical structures such as look-up tables (LUTs), registers (e.g., flip-flops or latches), multiplexers, etc.

The interconnections 1710 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 1708 to program desired logic circuits.

The storage circuitry 1712 of the illustrated example is structured to store result(s) of the one or more of the operations performed by corresponding logic gates. The storage circuitry 1712 may be implemented by registers or the like. In the illustrated example, the storage circuitry 1712 is distributed amongst the logic gate circuitry 1708 to facilitate access and increase execution speed.

The example FPGA circuitry 1700 of FIG. 17 also includes example Dedicated Operations Circuitry 1714. In this example, the Dedicated Operations Circuitry 1714 includes special purpose circuitry 1716 that may be invoked to implement commonly used functions to avoid the need to program those functions in the field. Examples of such special purpose circuitry 1716 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 1700 may also include example general purpose programmable circuitry 1718 such as an example CPU 1720 and/or an example DSP 1722. Other general purpose programmable circuitry 1718 may additionally or alternatively be present such as a GPU, an XPU, etc., that can be programmed to perform other operations.

Although FIGS. 16 and 17 illustrate two example implementations of the processor circuitry 1412 of FIG. 14 and the processor circuitry 1512 of FIG. 15, many other approaches are contemplated. For example, as mentioned above, modern FPGA circuitry may include an on-board CPU, such as one or more of the example CPU 1720 of FIG. 17. Therefore, the processor circuitry 1412 of FIG. 14 and the processor circuitry 1512 of FIG. 15 may additionally be implemented by combining the example microprocessor 1600 of FIG. 16 and the example FPGA circuitry 1700 of FIG. 17. In some such hybrid examples, a first portion of the machine readable instructions represented by the flowcharts of FIGS. 11, 12, and 13 may be executed by one or more of the cores 1602 of FIG. 16 and a second portion of the machine readable instructions represented by the flowcharts of FIGS. 11, 12, and 13 may be executed by the FPGA circuitry 1700 of FIG. 17.

In some examples, the processor circuitry 1412 of FIG. 14 and/or the processor circuitry 1512 of FIG. 15 may be in one or more packages. For example, the processor circuitry 1600 of FIG. 16 and/or the FPGA circuitry 1700 of FIG. 17 may be in one or more packages. In some examples, an XPU may be implemented by the processor circuitry 1412 of FIG. 14 and/or the processor circuitry 1512 of FIG. 15, which may be in one or more packages. For example, the XPU may include a CPU in one package, a DSP in another package, a GPU in yet another package, and an FPGA in still yet another package.

Figure 18:
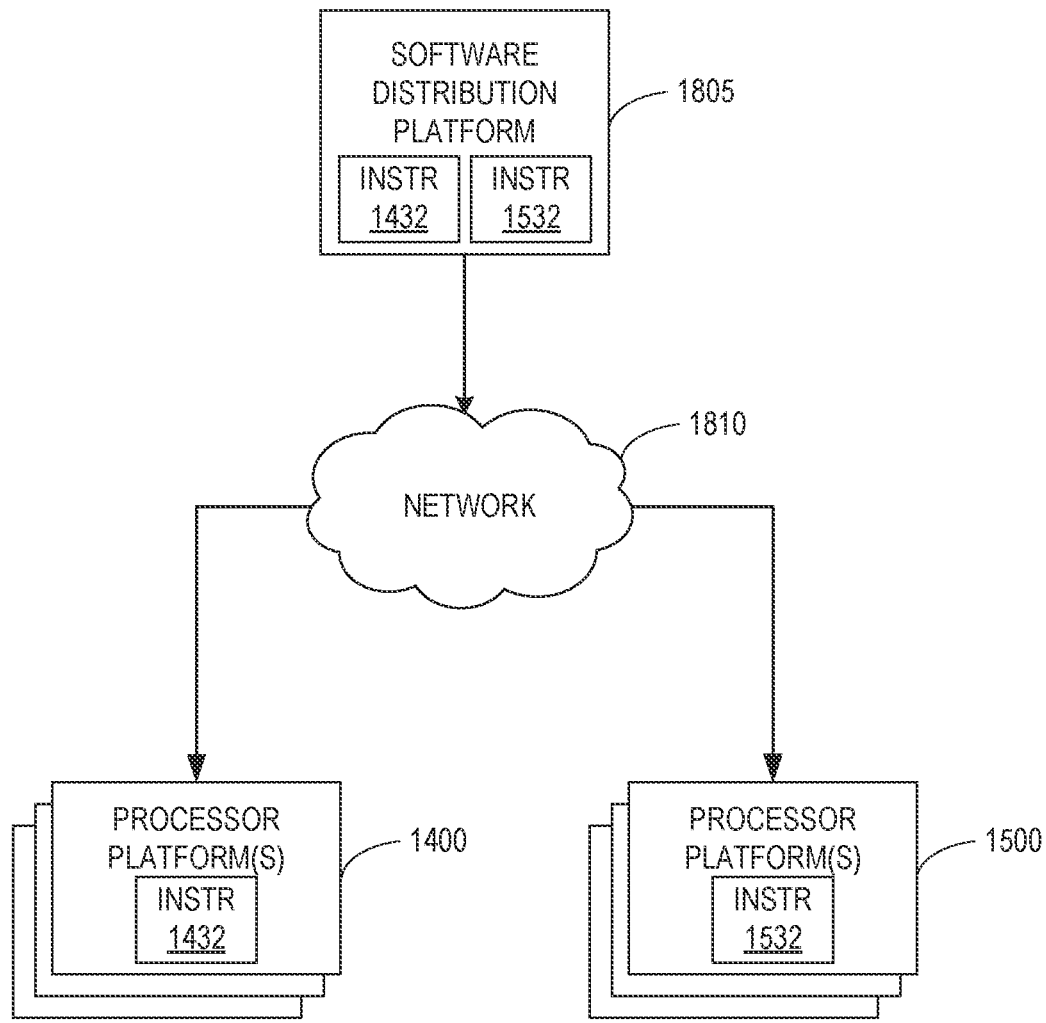
FIG. 18 is a block diagram of an example software distribution platform (e.g., one or more servers) to distribute software (e.g., software corresponding to the example machine readable instructions of FIGS. 11, 12, and 13) to client devices associated with end users and/or consumers (e.g., for license, sale and/or use), retailers (e.g., for sale, re-sale, license, and/or sub-license), and/or original equipment manufacturers (OEMs) (e.g., for inclusion in products to be distributed to, for example, retailers and/or to other end users as direct buy customers).

A block diagram illustrating an example software distribution platform 1805 to distribute software such as the example machine readable instructions 1432 of FIG. 14 and the example machine readable instructions 1532 of FIG. 15 to hardware devices owned and/or operated by third parties is illustrated in FIG. 18. The example software distribution platform 1805 may be implemented by any computer server, data facility, cloud service, etc., capable of storing and transmitting software to other computing devices. The third parties may be customers of the entity owning and/or operating the software distribution platform 1805. For example, the entity that owns and/or operates the software distribution platform 1805 may be a developer, a seller, and/or a licensor of software such as the example machine readable instructions 1432 of FIG. 14 and the example machine readable instructions 1532 of FIG. 15. The third parties may be consumers, users, retailers, OEMs, etc., who purchase and/or license the software for use and/or re-sale and/or sub-licensing. In the illustrated example, the software distribution platform 1805 includes one or more servers and one or more storage devices. The storage devices store the machine readable instructions 1432 and the machine readable instructions 1532, which may correspond to the example machine readable instructions 1100, 1200, 1300 of FIGS. 11, 12, and 13, as described above. The one or more servers of the example software distribution platform 1805 are in communication with a network 1810, which may correspond to any one or more of the Internet and/or any of the example networks 1426, 1526 described above. In some examples, the one or more servers are responsive to requests to transmit the software to a requesting party as part of a commercial transaction. Payment for the delivery, sale, and/or license of the software may be handled by the one or more servers of the software distribution platform and/or by a third party payment entity. The servers enable purchasers and/or licensors to download the machine readable instructions 1432 and the example machine readable instructions 1532 from the software distribution platform 1805. For example, the software, which may correspond to the example machine readable instructions 1432 of FIG. 14 and/or the example machine readable instructions 1532 of FIG. 15, may be downloaded to the example processor platforms 1400, 1500, which are to execute the machine readable instructions 1432, 1532 to implement the matrix compressing circuitry 104 and the matrix decompressing circuitry 106, respectively. In some example, one or more servers of the software distribution platform 1805 periodically offer, transmit, and/or force updates to the software (e.g., the example machine readable instructions 1432 of FIG. 14, the example machine readable instructions 1532 of FIG. 15) to ensure improvements, patches, updates, etc., are distributed and applied to the software at the end user devices.

From the foregoing, it will be appreciated that example methods, apparatus and articles of manufacture have been disclosed that accelerate compression and/or decompression of quantized neural networks utilizing unstructured sparsity. The examples disclosed herein reduce a memory bandwidth requirement and improves compute efficiency to enable accelerated inferences in neural networks. The disclosed methods, apparatus and articles of manufacture improve the efficiency of using a computing device reducing a memory bandwidth utilized to decompress data (e.g., neural network weights). As such, the examples disclosed herein accelerate the decompression of the data to enable accelerated learning for a neural network. The disclosed methods, apparatus and articles of manufacture are accordingly directed to one or more improvement(s) in the functioning of a computer.

Example methods, apparatus, systems, and articles of manufacture to perform weight and activation compression and decompression are disclosed herein. Further examples and combinations thereof include the following:

Example 1 includes an apparatus comprising memory, instructions in the apparatus, and processor circuitry to execute the instructions to execute a compression operation to obtain compressed data corresponding to weights in a weight matrix, and determine meta-data associated with the weight matrix, a first portion of the meta-data indicative of whether the weight matrix is compressed, a second portion of the meta-data indicative of a cache size of the compressed data, and a third portion of the meta-data indicative of the compression operation executed to obtain the compressed data.

Example 2 includes the apparatus of example 1, wherein the meta-data is a byte.

Example 3 includes the apparatus of example 1, wherein the first portion of the meta-data is of a first size, the third portion of the meta-data is of a second size larger than the first size, and the second portion of the meta-data is of a third size larger than the second size.

Example 4 includes the apparatus of example 1, wherein the first portion of the meta-data is a bit, wherein the processor circuitry is to assign a first value to the bit in response to the weight matrix being compressed, and assign a second value to the bit in response to the weight matrix being uncompressed.

Example 5 includes the apparatus of example 1, wherein the processor circuitry is to record a quantity of cache lines occupied by the compressed data in the second portion of the meta-data.

Example 6 includes the apparatus of example 1, wherein processor circuitry is to pack non-zero weights from the matrix into a compressed tile, and generate a bitmap indicative of respective locations of the non-zero weights in the weight matrix.

Example 7 includes the apparatus of example 1, wherein the compression operation is a first compression operation of a plurality of compression operations, the weight matrix is a first weight matrix, the compressed data is first compressed data, and the meta-data is first meta-data, wherein the processor circuitry is to execute the first compression operation or a second compression operation of the plurality of compression operations to obtain second compressed data associated with a second weight matrix, determine second meta-data associated with the second weight matrix, and store the first meta-data and the second meta-data in a first portion of a memory.

Example 8 includes the apparatus of example 7, wherein the processor circuitry is to store the first compressed data in a first set of cache lines of a second portion of the memory, and store the second compressed data in a second set of cache lines of the second portion of the memory subsequent to the first set of cache lines.

Example 9 includes a non-transitory machine readable medium comprising instructions which, when executed, cause one or more processors to execute a compression process to obtain compressed data corresponding to weights in a weight matrix, and determine meta-data associated with the weight matrix, a first portion of the meta-data indicative of whether the weight matrix is compressed, a second portion of the meta-data indicative of a cache size of the compressed data, and a third portion of the meta-data indicative of the compression process executed to obtain the compressed data.

Example 10 includes the non-transitory machine readable medium of example 9, wherein the meta-data is a byte.

Example 11 includes the non-transitory machine readable medium of example 9, wherein the first portion of the meta-data is of a first size, the third portion of the meta-data is of a second size larger than the first size, and the second portion of the meta-data is of a third size larger than the second size.

Example 12 includes the non-transitory machine readable medium of example 9, wherein the first portion of the meta-data is a bit, wherein the instructions, when executed, cause the one or more processors to assign a first value to the bit in response to the weight matrix being compressed, and assign a second value to the bit in response to the weight matrix being uncompressed.

Example 13 includes the non-transitory machine readable medium of example 9, wherein the instructions, when executed, cause the one or more processors to record a quantity of cache lines occupied by the compressed data in the second portion of the meta-data.

Example 14 includes the non-transitory machine readable medium of example 9, wherein the compressed data includes non-zero weights from the weight matrix and a bitmap indicative of respective locations of the non-zero weights in the weight matrix.

Example 15 includes the non-transitory machine readable medium of example 9, wherein the compression process is a first compression process, the weight matrix is a first weight matrix, the compressed data is first compressed data, and the meta-data is first meta-data, wherein the instructions, when executed, cause the one or more processors to execute the first compression process or a second compression process to obtain second compressed data associated with a second weight matrix, determine second meta-data associated with the second weight matrix, and store the first meta-data and the second meta-data in a first cache line of a linear memory.

Example 16 includes the non-transitory machine readable medium of example 15, wherein the instructions, when executed, cause the one or more processors to store the first compressed data in a first set of cache lines of the linear memory subsequent to the first cache line, and store the second compressed data in a second set of cache lines of the linear memory subsequent to the first set of cache lines.

Example 17 includes a method comprising executing a compression operation of a plurality of compression operations to obtain compressed data corresponding to weights in a weight matrix, and determining meta-data associated with the weight matrix, a first portion of the meta-data indicative of whether the weight matrix is compressed, a second portion of the meta-data indicative of a cache size of the compressed data, and a third portion of the meta-data indicative of the compression operation executed to obtain the compressed data.

Example 18 includes the method of example 17, wherein the meta-data is a byte.

Example 19 includes the method of example 17, wherein the first portion of the meta-data is of a first size, the third portion of the meta-data is of a second size larger than the first size, and the second portion of the meta-data is of a third size larger than the second size.

Example 20 includes the method of example 17, wherein the first portion of the meta-data is a bit, wherein determining the meta-data associated with the weight matrix includes assigning a first value to the bit in response to the weight matrix being compressed, and assigning a second value to the bit in response to the weight matrix being uncompressed.

Example 21 includes the method of example 17, wherein determining the meta-data associated with the weight matrix includes recording a quantity of cache lines occupied by the compressed data in the second portion of the meta-data.

Example 22 includes the method of example 17, wherein executing the compression operation includes packing non-zero weights from the weight matrix into a compressed array, and generating a bitmap indicative of respective positions of the non-zero weights in the weight matrix.

Example 23 includes the method of example 17, wherein the compression operation is a first compression operation of the plurality of compression operations, the weight matrix is a first weight matrix, the compressed data is first compressed data, and the meta-data is first meta-data, further including executing the first compression operation or a second compression operation of the plurality of compression operations to obtain second compressed data associated with a second weight matrix, determining second meta-data associated with the second weight matrix, and storing the first meta-data and the second meta-data in a first portion of a memory.

Example 24 includes the method of example 23, further including storing the first compressed data in a first set of cache lines of a second portion of the memory, and storing the second compressed data in a second set of cache lines of the second portion of the memory subsequent to the first set of cache lines.

Example 25 includes an apparatus comprising memory, instructions in the apparatus, and processor circuitry to execute the instructions to determine whether data associated with a weight matrix is compressed based on a first portion of meta-data associated with the data, and in response to the data being compressed determine a cache size of the data based on a second portion of the meta-data, and determine a compression process executed to compress the data based on a third portion of the meta-data.

Example 26 includes the apparatus of example 25, wherein the meta-data is first meta-data stored in a meta-data cache line of the memory, wherein the processor circuitry is to determine a location of the data based on at least second meta-data, the first meta-data following the second meta-data in the meta-data cache line.

Example 27 includes the apparatus of example 26, wherein the data is first data and the cache size is a first cache size, wherein the processor circuitry is to determine a second cache size of second data associated with the second meta-data, and determine the location of the first data based on a second cache size of second data.

Example 28 includes the apparatus of example 25, wherein the processor circuitry is to decompress the meta-data based on the cache size of the data and the compression process executed to obtain the data.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. An apparatus comprising:
memory;
instructions in the apparatus; and
processor circuitry to execute the instructions to:
execute a compression operation on a first portion of a matrix of weights for a neural network to obtain first compressed data, the first portion of the matrix is a sparse portion;
execute the compression operation on a second portion of the matrix of weights for a neural network to obtain second compressed data, the second portion of the matrix is a sparse portion;
determine first meta-data associated with the first compressed data and second meta-data associated with the second compressed data, a first portion of the first meta-data indicative of whether the first compressed data is compressed, a second portion of the first meta-data indicative of a cache size of the first compressed data, and a third portion of the first meta-data indicative of the compression operation executed to obtain the first compressed data;
cause the first meta-data and the second meta-data to be stored contiguously in a first row of a memory;
cause the first compressed data to be stored in a second row in the memory; and
cause the second compressed data to be stored in a third row in the memory, wherein the second row and the third row are consecutive rows.

2. The apparatus of claim 1, wherein the first meta-data is a byte.

3. The apparatus of claim 1, wherein the first portion of the first meta-data is of a first size, the third portion of the first meta-data is of a second size larger than the first size, and the second portion of the first meta-data is of a third size larger than the second size.

4. The apparatus of claim 1, wherein the first portion of the first meta-data is a bit, wherein the processor circuitry is to:

assign a first value to the bit in response to the first compressed data being compressed; and assign a second value to the bit in response to the first compressed data being uncompressed.

5. The apparatus of claim 1, wherein the processor circuitry is to record a quantity of cache lines occupied by the first compressed data in the second portion of the first meta-data.

6. The apparatus of claim 1, wherein the processor circuitry is to:
pack non-zero weights from the matrix of weights into a compressed tile; and
generate a bitmap indicative of respective locations of the non-zero weights in the matrix of weights.

7. A non-transitory machine readable medium comprising instructions which, when executed, cause one or more processors to:
execute a compression operation on a first portion of a matrix of weights for a neural network to obtain first compressed data, the first portion of the matrix is a sparse portion;
execute the compression operation on a second portion of the matrix of weights for a neural network to obtain second compressed data, the second portion of the matrix is a sparse portion;
determine first meta-data associated with the first compressed data and second meta-data associated with the second compressed data, a first portion of the first meta-data indicative of whether the first compressed data is compressed, a second portion of the first meta-data indicative of a cache size of the first compressed data, and a third portion of the first meta-data indicative of the compression operation executed to obtain the first compressed data;
cause the first meta-data and the second meta-data to be stored contiguously in a first row of a memory;
cause the first compressed data to be stored in a second row in the memory; and
cause the second compressed data to be stored in a third row in the memory, wherein the second row and the third row are consecutive rows.

8. The non-transitory machine readable medium of claim 7, wherein the first meta-data is a byte.

9. The non-transitory machine readable medium of claim 7, wherein the first portion of the first meta-data is of a first size, the third portion of the first meta-data is of a second size larger than the first size, and the second portion of the first meta-data is of a third size larger than the second size.

10. The non-transitory machine readable medium of claim 7, wherein the first portion of the first meta-data is a bit, wherein the instructions, when executed, cause the one or more processors to:
assign a first value to the bit in response to the first compressed data being compressed; and
assign a second value to the bit in response to the first compressed data being uncompressed.

11. The non-transitory machine readable medium of claim 7, wherein the instructions, when executed, cause the one or more processors to record a quantity of cache lines occupied by the first compressed data in the second portion of the first meta-data.

12. The non-transitory machine readable medium of claim 7, wherein the compressed data includes non-zero weights from the matrix of weights and a bitmap indicative of respective locations of the non-zero weights in the matrix of weights.

13. A method comprising:
executing a compression operation on a first portion of a matrix of weights for a neural network to obtain first compressed data, the first portion of the matrix is a sparse portion;
executing the compression operation on a second portion of the matrix of weights for a neural network to obtain second compressed data, the second portion of the matrix is a sparse portion;
determining first meta-data associated with the first compressed data and second meta-data associated with the second compressed data, a first portion of the first meta-data indicative of whether the first compressed data is compressed, a second portion of the first meta-data indicative of a cache size of the first compressed data, and a third portion of the first meta-data indicative of the compression operation executed to obtain the first compressed data;
causing the first meta-data and the second meta-data to be stored contiguously in a first row of a memory;
causing the first compressed data to be stored in a second row in the memory; and
causing the second compressed data to be stored in a third row in the memory, wherein the second row and the third row are consecutive rows.

14. The method of claim 13, wherein the first meta-data is a byte.

15. The method of claim 13, wherein the first portion of the first meta-data is of a first size, the third portion of the first meta-data is of a second size larger than the first size, and the second portion of the first meta-data is of a third size larger than the second size.

16. The method of claim 13, wherein the first portion of the first meta-data is a bit, wherein determining the first meta-data associated with the first compressed data includes:
assigning a first value to the bit in response to the first compressed data being compressed; and
assigning a second value to the bit in response to the first compressed data being uncompressed.

17. The method of claim 13, wherein determining the first meta-data includes a quantity of cache lines occupied by the first compressed data in the second portion of the second meta-data.

18. The method of claim 13, wherein executing the compression operation includes:
packing non-zero weights from the matrix of weights into a compressed array; and
generating a bitmap indicative of respective positions of the non-zero weights in the matrix of weights.

* * * * *